United States Patent [19]
Nyyssonen

[11] Patent Number: 5,633,714
[45] Date of Patent: May 27, 1997

[54] PREPROCESSING OF IMAGE AMPLITUDE AND PHASE DATA FOR CD AND OL MEASUREMENT

[75] Inventor: Diana Nyyssonen, Hopewell Junction, N.Y.

[73] Assignee: International Business Machines Corporation, Armonk, N.Y.

[21] Appl. No.: 359,225

[22] Filed: Dec. 19, 1994

[51] Int. Cl.$^6$ .................................................. G01B 9/02
[52] U.S. Cl. .................................... 356/359; 356/345
[58] Field of Search ................. 356/345, 359, 356/360

[56] References Cited

PUBLICATIONS

D. Nyyssonen, J. Seligson and I. Mazor, "Phase Image Metrology with a Modified Coherence Probe Microscope," Proc. SPIE vol. 1926–23, pp. 299–310 (1993).
V. Tychinsky and A. Tavrov describe in "Optical 3D Monitoring VLSI Structures" Proc. SPIE vol. 1673, pp. 483–485 (1992).
E. C. Kintner, "Method for the Calculation of Partially Coherent Imagery," App. Opt. 17, pp. 2747–2753 (1978).
D. Nyyssonen and C. Kirk, "Optical Microscope Imaging of Lines Patterned in Thick Layers with Variable Edge Geometry: Theory," J. Opt. Soc. Am. A 5, pp. 1270–1280 (1988).
M. Davidson, K. Kaufman and I. Mazor, "First Results of a Product Utilizing Coherence Probe Imaging for Wafer Inspection," Proc. SPIE vol. 921, (1988) pp. 1270–1280.

D. Nyyssonen, "Narrow–Angle Laser Scanning Microscope Systems for Linewidth Measurements on Wafers," NISTIR 88–3808, pp. 1–107 (Jun. 1988).

Primary Examiner—Georgia Y. Epps
Assistant Examiner—Robert Kim
Attorney, Agent, or Firm—Graham S. Jones, II

[57] ABSTRACT

An optical method measures a pattern on a substrate with the output of an optical imaging system, amplitude and phase imaging for narrow angle, single wavelength, polarized illumination in a coherence probe type of interferometric microscope system, the microscope system including a microprocessor providing signals derived from the amplitude and phase imaging. Derive raw interferometer fringe amplitude and phase data from the microprocessor. Converting the fringe amplitude and phase data into amplitude and phase data. Derive a fourier transform of the amplitude and phase data. Apply corrections to the transformed data. Select image type and then means for deriving the inverse transform from the corrected data and processing to provide amplitude and phase image data as a first image output, and/or bright field image processing to provide a second image output, and/or dark field image processing to provide a third image output, and/or processing of the corrected phase image $P''(\mu, z_n)$ to provide a fourth image output, and process corrected amplitude $a''(\mu, z_n)$ to provide a fifth image output, and means for measuring critical dimension or overlay from one of the image outputs.

17 Claims, 16 Drawing Sheets

PREPROCESSING OF IMAGE AMPLITUDE AND PHASE DATA FOR CD AND OL MEASUREMENT

BACKGROUND OF THE INVENTION

1. Field of the Invention

This invention relates to optical microscope imaging and measurement systems and more particularly to a system and a method of processing optically measured data.

2. Description of Related Art

D. Nyyssonen, J. Seligson and I. Mazor, "Phase Image Metrology with a Modified Coherence Probe Microscope," Proc. SPIE Vol. 1926–23, pp 299–310 (1993) describes a coherence probe microscope measurement prior art system.

V. Tychinsky and A. Tavrov describe in "Optical 3D Monitoring VLSI Structures" PROC. SPIE Vol. 1673, pp. 483–485 (1992) the use of phase images for CD (critical dimension) measurement. The phase images were obtained with a HeNe laser (632.8 nm) and a Linnik interferometer. Their results show an increase in resolution based on scalar theory simulations and experimental data.

E. C. Kintner, "Method for the Calculation of Partially Coherent Imagery," App. Opt. 17, pp. 2747–2753 (1978), which pertains to scalar image modeling describes a method using Fourier transforms to model the performance of a 1-D optical system with aberrations or apodization.

D. Nyyssonen and C. Kirk, "Optical Microscope Imaging of Lines Patterned in Thick Layers with Variable Edge Geometry: Theory," J. Opt. Soc. Am. A 5, pp. 1270–1280 (1988) describes a monochromatic waveguide model that can predict the optical microscope images of line objects with arbitrary edge geometry. The article pertains to vector image modeling which is pertinent because scalar image calculations cannot accurately predict images of thick objects where mode coupling occurs. Both of these references use Fourier transform techniques to compute images.

M. Davidson, K. Kaufman and I. Mazor, "First Results of a Product Utilizing Coherence Probe Imaging for Wafer Inspection," Proc. SPIE Vol. 921, (1988) describes a white light coherence probe microscope measurement system.

D. Nyyssonen, "Narrow-Angle Laser Scanning Microscope Systems for Linewidth Measurements on Wafers," NISTIR 88–3808, pp 1–107 (Jun. 1988) states at page 12, states that a thickness of 180-nm $SiO_2$ on a silicon wafer produces a nearly pure phase image which has been shown to be sensitive to small amounts of optical aberrations.

SUMMARY OF THE INVENTION

Numerous problems exist with CD and OL measurements because they depend upon determining the dimensions from images produced by a measurement tool. Aberrations in the optical system cause errors in the overlay measurements. Defocus causes errors. Multiple levels are present on a wafer, but they are not all in focus at the same time in a microscope, thus requiring multiple passes which can generate errors attributable to underlying mechanical and optical errors. Also, varying thicknesses of films leads to errors due to optical interference.

Phase images eliminate some of the problems associated with the nonlinearity problems caused by varying film thickness in bright field optical miscroscopy of such films.

An object of this invention is to improve imaging, as well as CD and OL measurements by improving image quality.

In addition to correction for sources of error such as aberrations, with this invention, it is possible to segment the field and correct only for the portions of the field which are out of focus.

In accordance with this invention an imaging system for a pattern on a substrate, comprises the following. Means for amplitude and phase imaging for narrow angle, single wavelength, polarized illumination in an interferometric microscope system; the microscope system including a microprocessor providing signals derived from the amplitude and phase imaging, means for deriving raw interferometer fringe data from the microprocessor, means for converting the fringe data into amplitude and phase data, means for deriving the fourier transform of the amplitude and phase data, means for applying corrections to the transformed data, means for selecting image type and then means for deriving the inverse transform from the corrected data and processing to provide amplitude and phase image data as a first image output, and /or bright field image processing to provide a second image output, and/or dark field image processing to provide a third image output, and/or processing of the corrected phase image $p''(\mu,z_n)$ to provide a fourth image output, and processing of corrected amplitude $a''(\mu,z_n)$ to provide a fifth image output.

Preferably, the system determines the critical dimension or overlay from the first, second, third, fourth and/or fifth image output; and determines at least one dimension of at least one shape in the layered structure from one of the image outputs.

Preferably, an optical measuring method measures a pattern on a substrate with the output of an optical imaging system, amplitude and phase imaging for narrow angle, single wavelength, polarized illumination in a coherence probe type of interferometric microscope system, the microscope system including a microprocessor providing signals derived from the amplitude and phase imaging. The method comprises deriving raw interferometer fringe amplitude and phase data from the microprocessor, converting the fringe amplitude and phase data into amplitude and phase data, deriving a fourier transform of the amplitude and phase data, and applying corrections to the transformed data, selecting image type and then deriving the inverse transform from the corrected data and processing to provide amplitude and phase image data as a first image output, and/or bright field image processing to provide a second image output, and/or dark field image processing to provide a third image output, and/or processing of the corrected phase image $p''(\mu,z_n)$ to provide a fourth image output, and processing of corrected amplitude $a''(\mu,z_n)$ to provide a fifth image output, and measuring critical dimension or overlay from one of the image outputs.

Preferably, corrections are provided for defocus, asymmetry, noise, and aberrations of the optical components.

Preferably, the method provides for using an optical measuring system for measuring critical dimension or overlay of a pattern on a substrate, the system comprising an optical imaging system, with amplitude and phase imaging for narrow angle, single wavelength, polarized illumination in a coherence probe type of interferometric microscope system, the microscope system including a microprocessor providing signals derived from the amplitude and phase imaging, the method comprising selecting image type and then phase image processing to provide a first image output, bright field processing to provide a second image output, dark field processing to provide a third image output, corrected $P(\mu,z_n)$ processing to provide a fourth image output, corrected $A(\mu,z_n)$ processing to provide a fifth image output, and then finding critical dimension or overlay from the first second, third, fourth and fifth output.

It is preferred to determine at least one dimension of at least one shape in the layered structure from one of the image outputs.

In accordance with still another aspect of this invention, an optical measurement system for a pattern on a substrate comprises the following system. Means for amplitude and phase imaging for narrow angle, single wavelength, polarized illumination in an interferometric microscope system, the microscope system including a microprocessor providing signals derived from the amplitude and phase imaging, means for deriving raw interferometer fringe amplitude and phase data from the microprocessor, means for converting the fringe amplitude and phase data into amplitude and phase data, deriving the fourier transform of the amplitude and phase data, and means for applying corrections to the transformed data, means for measuring CD from $A(\mu, z_n)$, $P(\mu, z_n)$.

Preferably, corrections are provided for defocus, asymmetry, noise, and aberrations of the optical components, for enhancement of amplitude and or phase signal contrast, and for distortion of the image due to thick layer effects; and corrections are provided for aberrations of the optical components.

BRIEF DESCRIPTION OF THE DRAWINGS

The foregoing and other aspects and advantages of this invention are explained and described below with reference to the accompanying drawings, in which.

While

Now, given the good quality image amplitude and phase data in FIGS. 7A–7C, it is possible to generate other types of images corresponding to less spatial coherence, dark field imaging, etc

DESCRIPTION OF THE PREFERRED EMBODIMENT

Capturing amplitude and phase data at a single wavelength and narrow Θ is fundamental to being able to perform all the tasks required in accordance with this invention. When data has been processed in such a way that part of its content has been destroyed or corrupted in the process the destroyed or corrupted data cannot be recaptured. Thus, it is not possible to correct for aberrations, focus, etc. or to create dark field (DF), bright field (BF) apodized, filtered, etc. images from intensity data, which has been processed previously eliminating much of the data required to make a satisfactory analysis. Intensity images have been transformed by integration over the wavelength (lambda) and integration over the illumination angle, and they have lost phase information also. Thus it is not possible to correct the lost phase information and provide other types of imagery.

In normal microscopy, all of the types of analysis performed by this invention are performed by specialized hardware, such as separate bright field or dark field microscopes. In accordance with this invention a single system can generate many different kinds of images, e.g. confocal, bright field, dark field, etc. The advantage is that with a single set of amplitude and phase data this data processing system can generate any type of microscope image desired including a confocal image, etc. From one set of hardware, we can have the versatility normally found only in multiple microscope systems.

This invention produces improved intensity images or improved phase images (amplitude/real/imaginary) or can make measurements on any and all image types.

Also, for overlay, this invention can segment a field and correct focus for the portion of the field in the "out of focus plane" so many sub-fields are possible if enough pixels of image data are available.

Figure 1A:
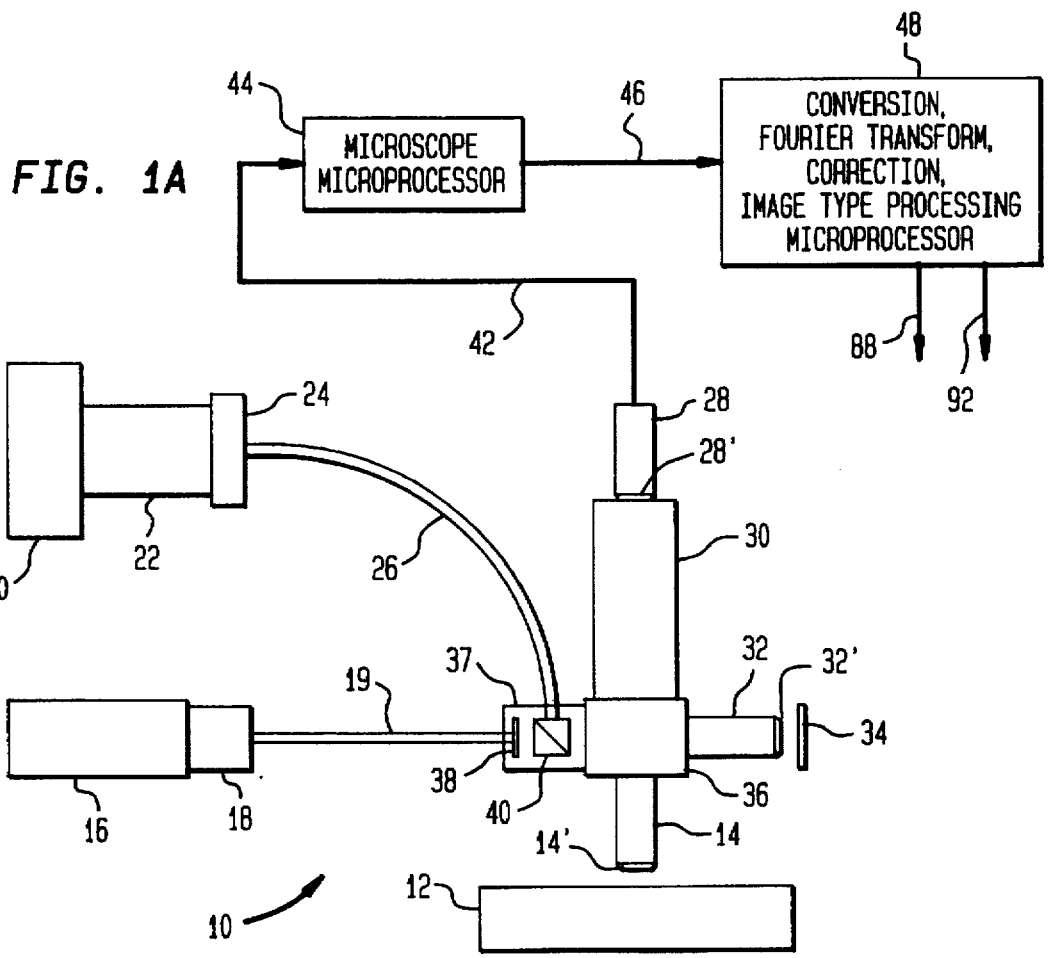
FIG. 1A shows a coherence probe microscope adapted for use in connection with an embodiment of this invention, an alternative embodiment can incorporate a different type of interferometric microscope system, such as a Mireau interferometer.
Figure 1B:
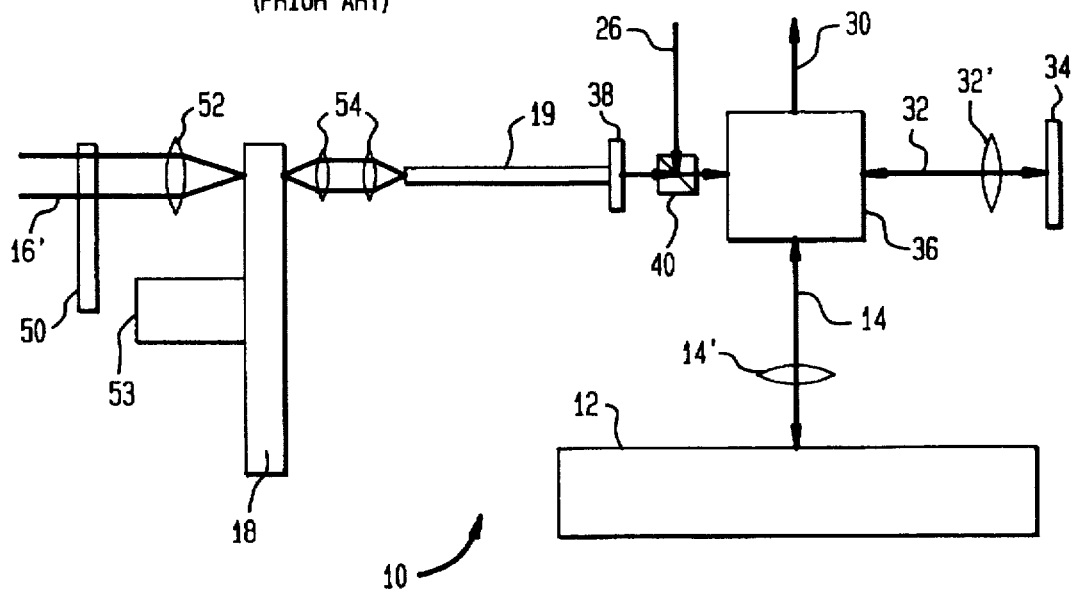
FIG. 1B shows a prior art apparatus illustrating the directions of the light paths employed in the optical system of FIG. 1A.

While FIG. 1A shows a coherence probe microscope adapted for use in connection with an embodiment of this invention, an alternative embodiment can incorporate a different type of interferometric microscope system, such as a Mireau interferometer. FIG. 1A shows an embodiment of this invention including a measurement system 10 adapted for use with this invention. Measurement system 10 employs a coherence probe type of interferometric microscope system with narrow angle, single wavelength, polarized TE (Transverse Electric) illumination of the workpiece 12 such as a silicon wafer with a 180-nm thick SiO$_2$ pattern thereon to be measured. (Nyyssonen, above.) Polarization is an issue for only some samples, not for all patterns. Transverse Electric (TE) illumination in this context refers to measurement with the magnetic field polarized in the direction parallel to the lines whose width is being measured with the electric field perpendicular. TE illumination is preferred for measurement of lines because of higher resolution, but is not necessary for all patterns. FIG. 1B shows directions of the light paths employed in the optical system of FIG. 1A. The system in FIG. 1A includes objective 14 with its lens 14' connected to the bottom input of a Linnik interferometer 36. The other input of the Linnik interferometer is an illuminator system 37 which includes a polarizer 38 and beam splitter 40.

In the dual fiber illuminator system 37, either the light from the laser and/or the light from the arc lamp 20 illuminates the sample by using a 70%/30% beam splitter 40 (70% of the laser light or 30% of the arc lamp are used.) The 70%/30% beam splitter 40 is used so that the detector will not be damaged when changing from white light to laser light and back and forth. White light is used in conventional operation. Sheet polarizer 38 is located at the exit from the 250 μm optical fiber 19 to assure linear polarization of the laser light in the y-direction at the device under test which is wafer 12. A data microprocessor 48 with programming in accordance with this invention is connected to receive the output of microscope microprocessor 44.

Referring to FIGS. 1A and 1B, an air-cooled, continuous-wave, argon-ion laser 16 has a wavelength of 514 nm with a maximum nominal power of 80 mW. Laser 16 supplies monochromatic laser light 16' which passes by pneumatically operated shutter 50 through achromat lens 52 (f=56 mm) then onto a spot on a rotating ground glass diffuser 18. Then the diffused spot is imaged by a pair of back-to-back achromats 52 f=20 mm onto the entrance aperture of a single optical fiber light guide 19 (250 μm diameter) to the polarizer 38 in input block 37. The laser light 16' passes through diffuser 18 passes through a single fiber light guide 19 to the polarizer 38 in input block 37. The laser shutter 50 is connected to the ring on/ring off circuit of the microscope system. The illumination NA is 0.10 which is effectively coherent, but does not have the laser speckle and coherent noise associated with a completely coherent (raw) laser beam. The rotating diffuser allows control of the illumination NA, where NA is the formula by which the illuminating and resolving power of a high power microscope objective is calculated.

NA=n sin u where
n=refractive index of the medium.
u=semiangle of the aperture.

The ring setting controls the illuminating NA, 0.10 for the laser beam and 0.9 for white light imaging.

The light from polarizer 38 passes through beam splitter 40 into the Linnik interferometer 36. A xenon arc lamp 20 supplies light through relay lens 22 to light level control 24 which in turn supplies light to light guide 26 which supplies light to the top face of beam splitter 40. Beam splitter 40 supplies either light from illuminator 37 (laser light from guide 19 and polarizer 38) or white light reflected by the mirror surface of beam splitter 40, to the left window of Linnik interferometer 36 in FIG. 1B.

Above the Linnik interferometer 36 is a post-magnification system 30 comprising a relay lens which images the sample onto the face of the camera 28.

Above the post-magnification system 28 is a CCD (charge coupled device) camera 28 with lens 28' which records the images projected thereon from the Linnik interferometer 36 and the lens system 30. In the prior art system, the microscope microprocessor 48 with programming in accordance with this invention is connected to receive the output of microprocessor 44 which is connected to receive the output of CCD (Charge Coupled Device) camera 28.

A problem with the results of data from the prior art portion of the apparatus of FIG. 1A shown in both of FIGS. 1A and 1B is defocus, aberration, and coherent image artifacts when making CD (Critical Dimension) and OL (Overlay) measurements (where overlay is generally speaking displacement between the centers of superimposed line patterns.)

Optical CD measurements are usually based upon an edge detection criterion such as a threshold applied to an intensity image.

There are two fundamental problems with intensity imaging that cause dimensional measurement errors and nonlinearity. These prior art measurements are illustrated in Nyyssonen et al. above (in FIGS. 1 and 2 thereof.) First there Is sensitivity to substrate thickness. Secondly, there is distortion of the scattered field as the thickness of the patterned layer increases.

Figure 1C:
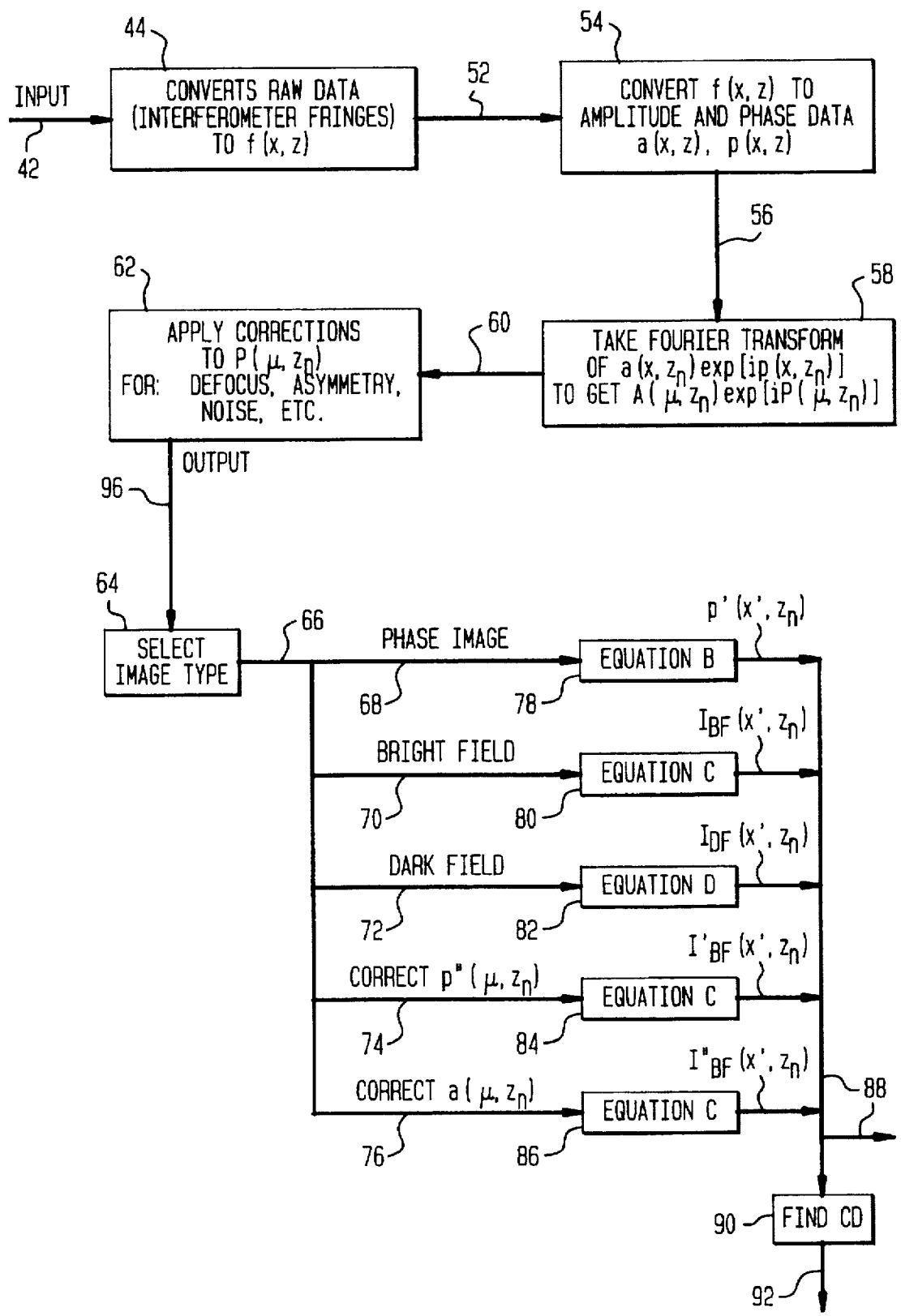
FIG. 1C is a flow chart of the sequence of operations of the microscope microprocessors in FIG. 1A.
Figure 2A:
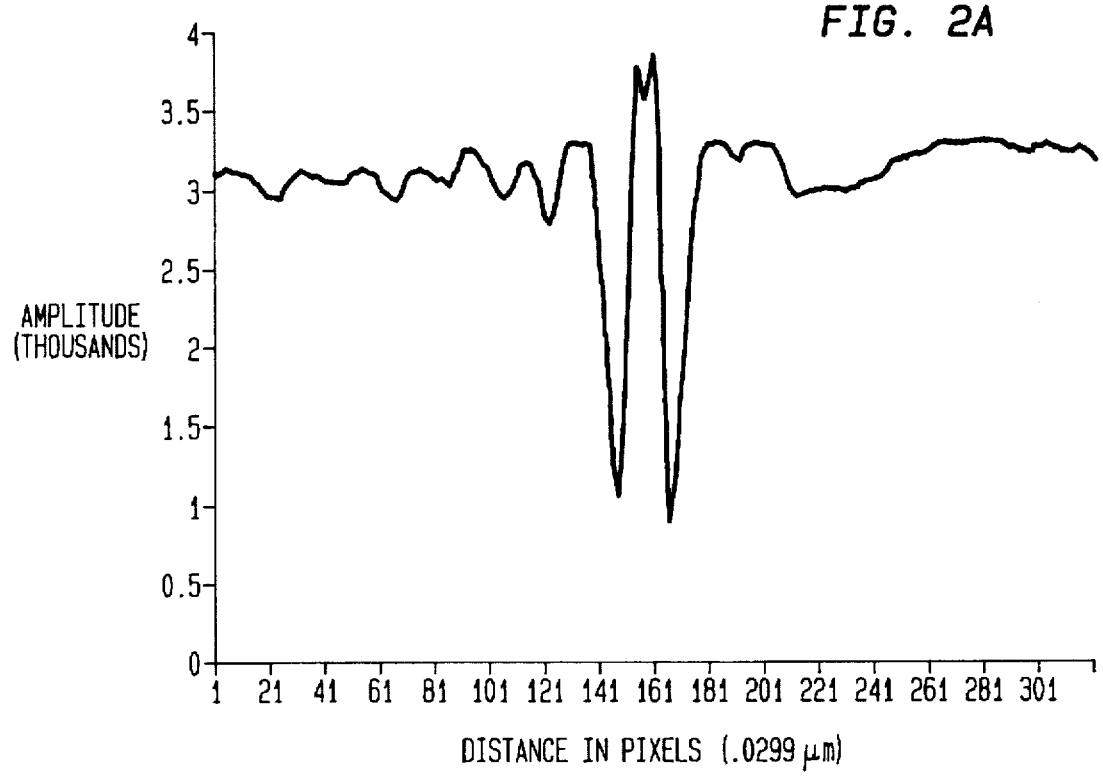
FIGS. 2A–2D, 3A–3D, 4A–4C, and 5A–5C are graphs which demonstrate the ability to correct for defocus.
Figure 2B:
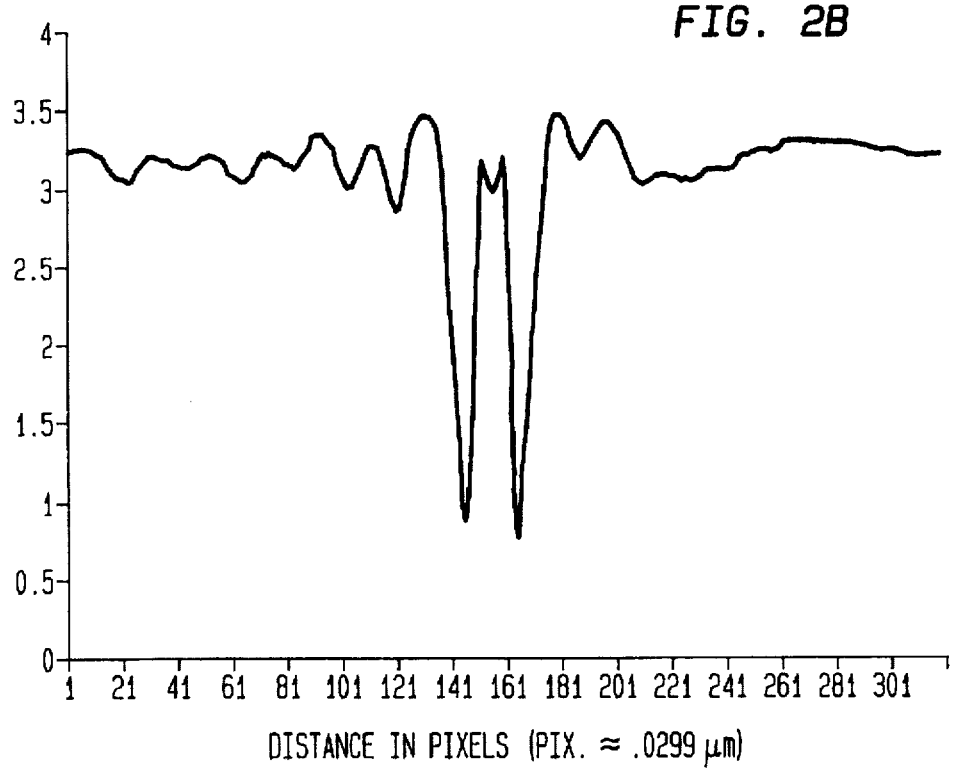
Figure 2C:
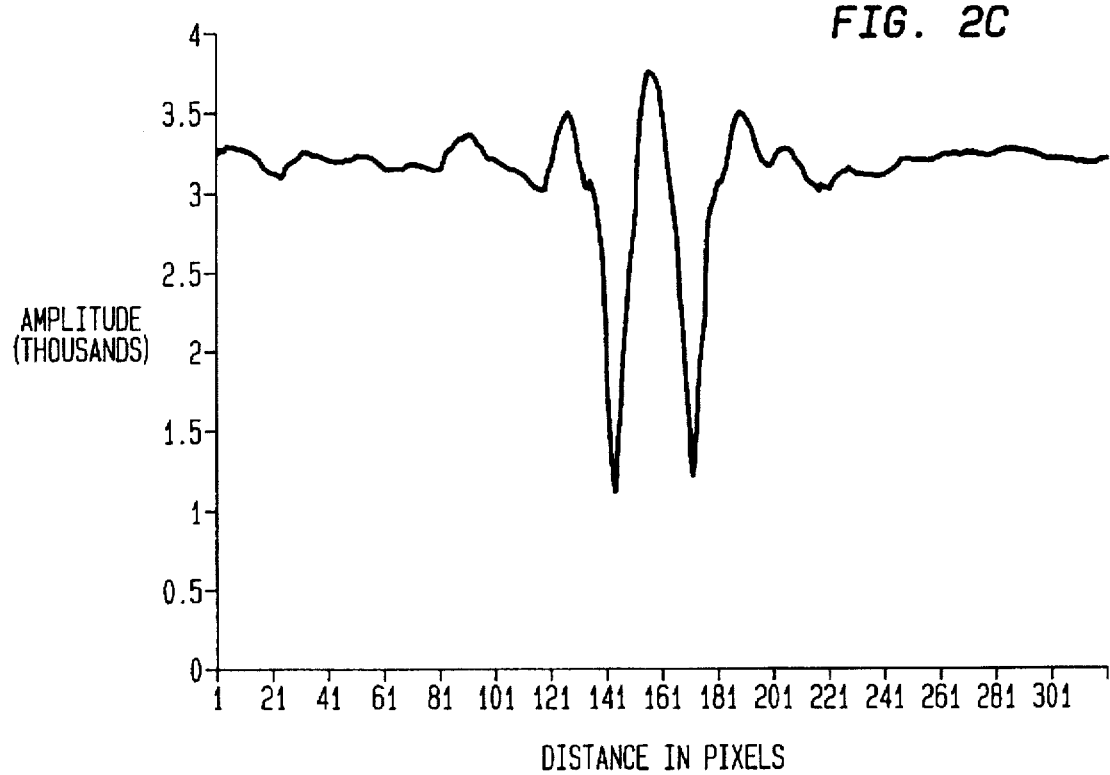
Figure 2D:
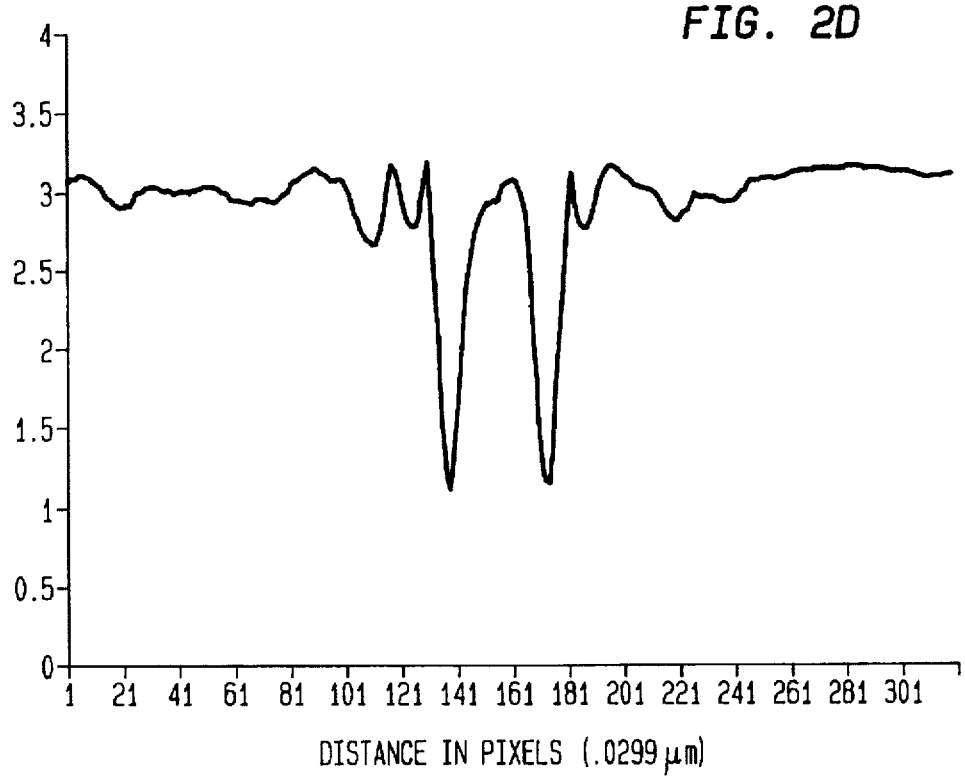
Figure 3A:
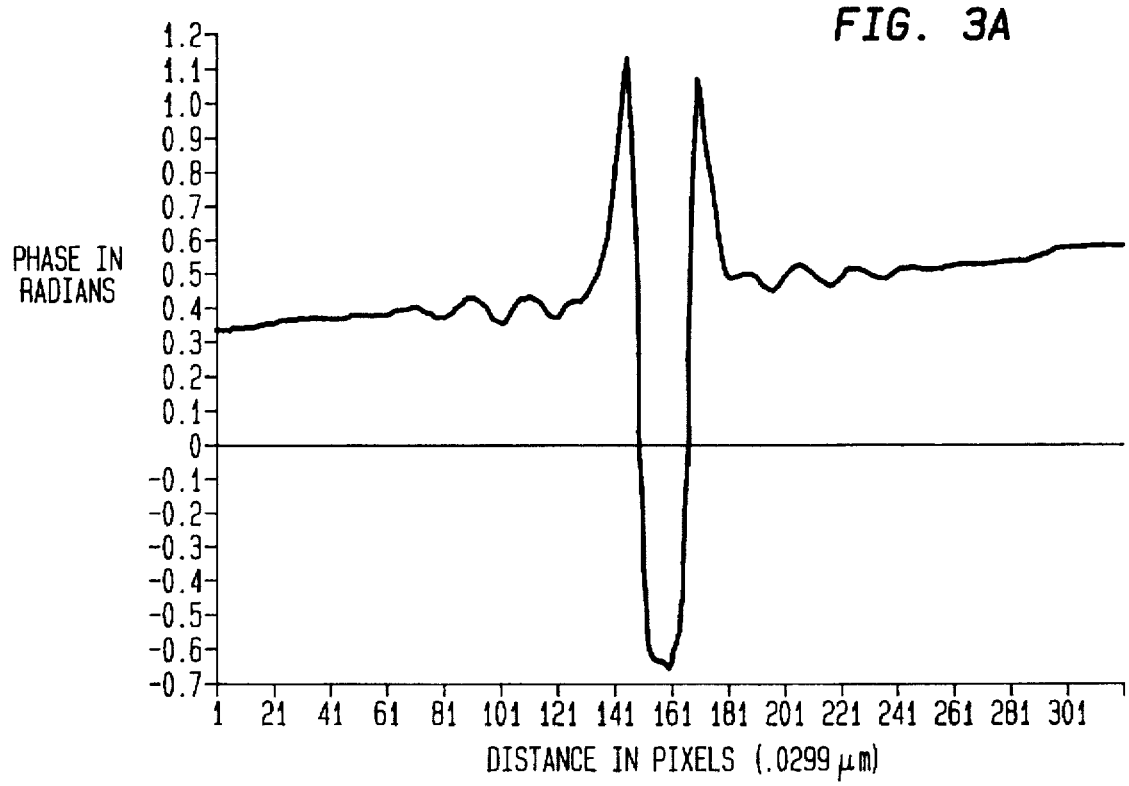
Figure 3B:
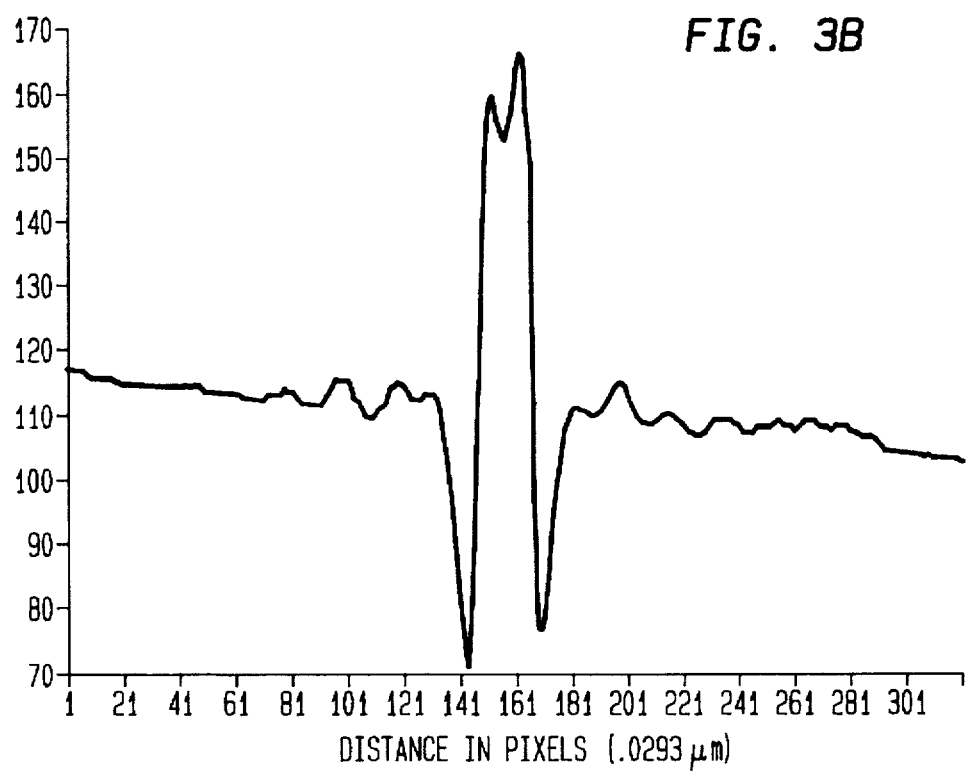
Figure 3C:
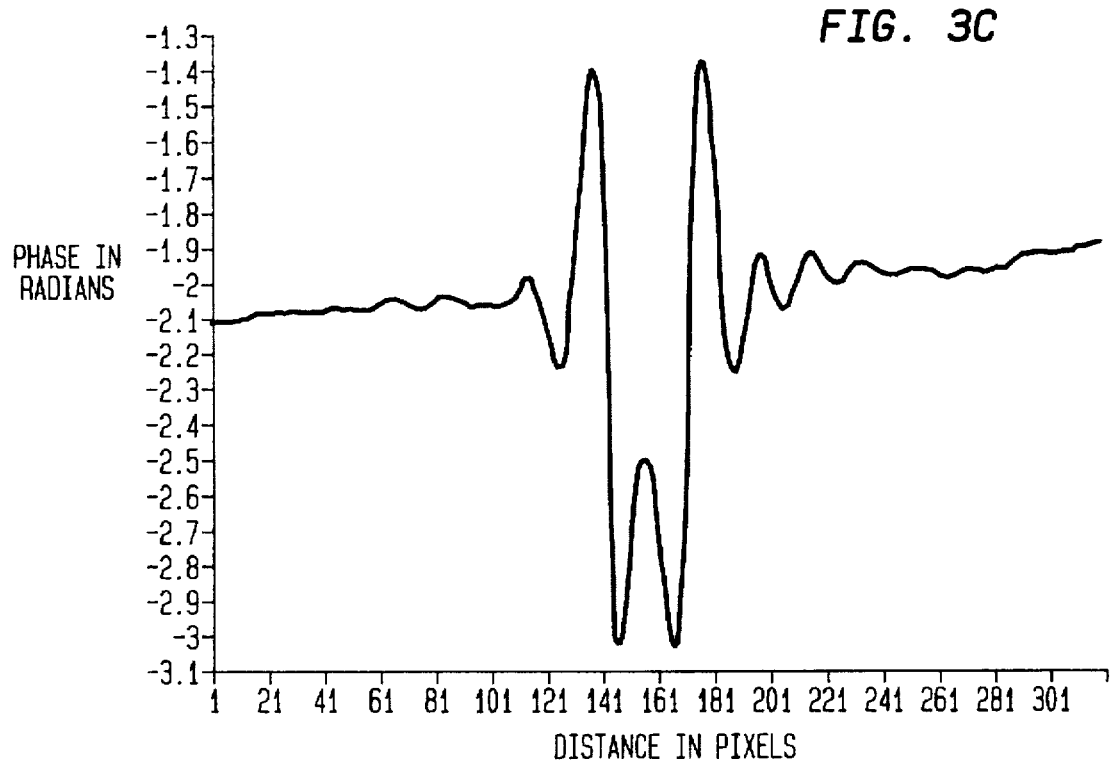
Figure 3D:
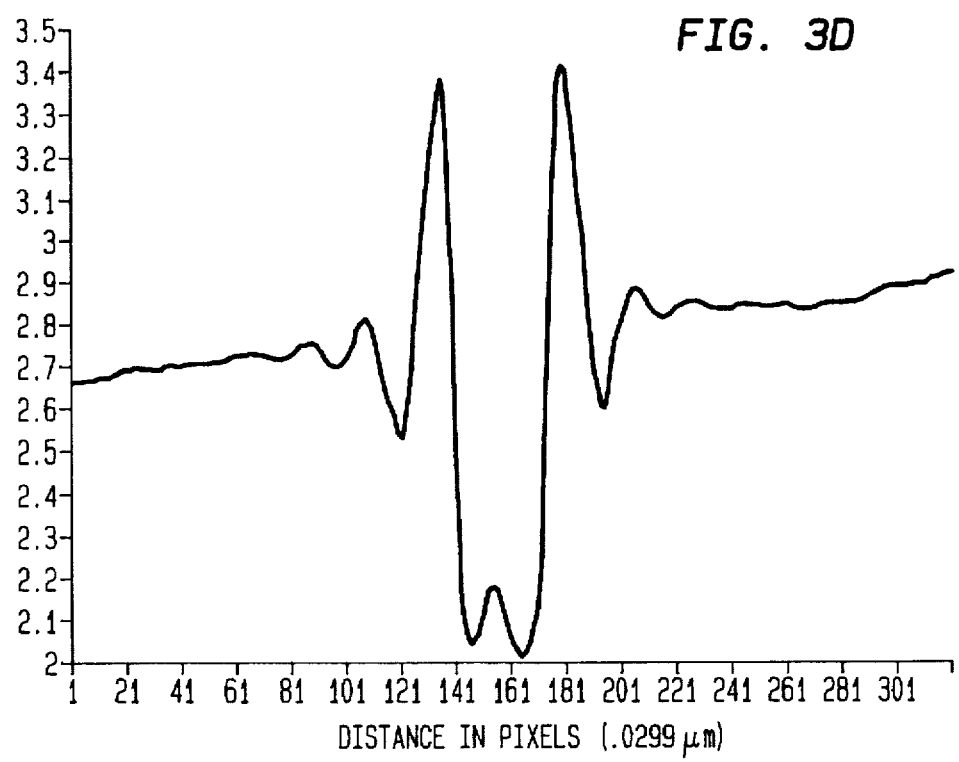

FIG. 1C is a flow chart of the sequence of operations of microscope microprocessors 44 and 48 in FIG. 1A including a multiplicity of possible sequences of operations of data microprocessor 48A.

The raw data processor 44 converts raw interferometer data to the intermediate data f(x,y). In FIG. 1C, the input data from line 46 in FIG. 1A is supplied to conversion processor 54 which converts f(x,z) to amplitude and phase data a(x, z) and p(x,z). The converted data passes from processor 54 on line 56 to fourier transform processor 58 which takes the fourier transform of $a(x,z_n) \exp[ip(x,z_n)]$ to get $A(\mu,z_n) \exp[(ip(\mu,z_n)]$. Then the output of fourier transform processor 58 is passed on line 60 to correction processor 62 which applies corrections to $P(\mu,z_n)$ for defocus, asymmetry, noise, etc. which supplies an output on line 96 from the correction processor 62 in FIG. 1C to the image selector 64 in FIG. 1C.

Formulas which are used in microprocessor 48 are as follows:

RELEVANT FORMULAS

GIVEN $F(\mu,z_n) = a(\mu,z_n)\exp[ip'(\mu, z_n)]$   EQUATION A
where $p'$ is corrected phase $a'(\mu, z_n)\exp[ip'(\mu, z_n)]$ = FOURIER TRANSFORM OF   EQUATION B
$F(\mu, z_n)$ $I_{BF}(\mu, z_n)$ = FOURIER TRANSFORM OF   EQUATION C
$\int T(\mu,\mu')F(\mu)F^*(\mu')d\mu'$
where $T$ is the transmission cross-coefficient
for the lens (see Kinter)

Annular Source
$I_{DF}(\mu, z_n)$ = FOURIER TRANSFORM OF   EQUATION D
$\int T'(\mu,\mu')F(\mu)F^*(\mu')d\mu'$ The microprocessor 48 operates on the data on line 96 which is supplied to the select image selector 64 which selects the image type to be processed by microprocessor 48 and supplied on output line 88. There are five types of possible output signals shown from selection processor 64 on line 66, which are as follows:

- calls for a phase image on line 68 to invoke equation B in processor 78 producing output $p'(\mu,z_n)$;
- calls for a bright field image on line 70 to invoke equation C in processor 80 producing output $I_{BF}(\mu,z_n)$;
- calls for a dark field image on line 72 to invoke equation D in processor 82 producing output $I_{DF}(\mu,z_n)$;
- calls for corrected phase $p''(\mu,z_n)$ on line 74 to invoke equation C in processor 84 producing output $I'_{BF}(\mu,z_n)$; and/or
- calls for corrected amplitude $a(\mu,z_n)$ on line 76 to invoke equation C in processor 86 producing output $I''_{BF}(\mu,z_n)$.

The outputs of processors 78, 80, 82, 84 and 86 are supplied to line 88 which is an output of microprocessor 48 in FIG. 1A which is useful as a system output. Alternatively, the data on line 88 can be supplied to find the critical dimension with processor 90 which supplies an output on line 92 from microprocessor 48. The critical dimension is found by using a threshold or steepest slope or correlation or other edge finding algorithm.

When one obtains image amplitude and phase data from a phase image metrology tool such as the above coherence probe type of interferometric microscope system, it is desirable to produce improved CD and OL measurements using the data. Techniques (options) for producing improved CD and OL measurements using the data are made possible because amplitude and phase data is available taken for single wavelength at a single angle of incidence (514 nm, 0.10 NA condenser) corresponding to coherent monochromatic illumination. Those techniques include as follows:

a) correction for defocus and aberrations of the measurement system, b) ability to produce images corresponding to other types of microscopy, and c) improvement in images by elimination of effects associated with thick layer imaging.

In order to demonstrate the above techniques two amplitude and phase data files have been taken from the modified coherence probe system corresponding to the amplitude and phase images of a 0.68 μm line patterned in thin oxide (0.18 μm thick oxide on silicon.) Although a thickness of only 0.18 μm is considered relatively "thin", the amplitude and phase data shows some effects from thick layer imaging.

Figure 4A:
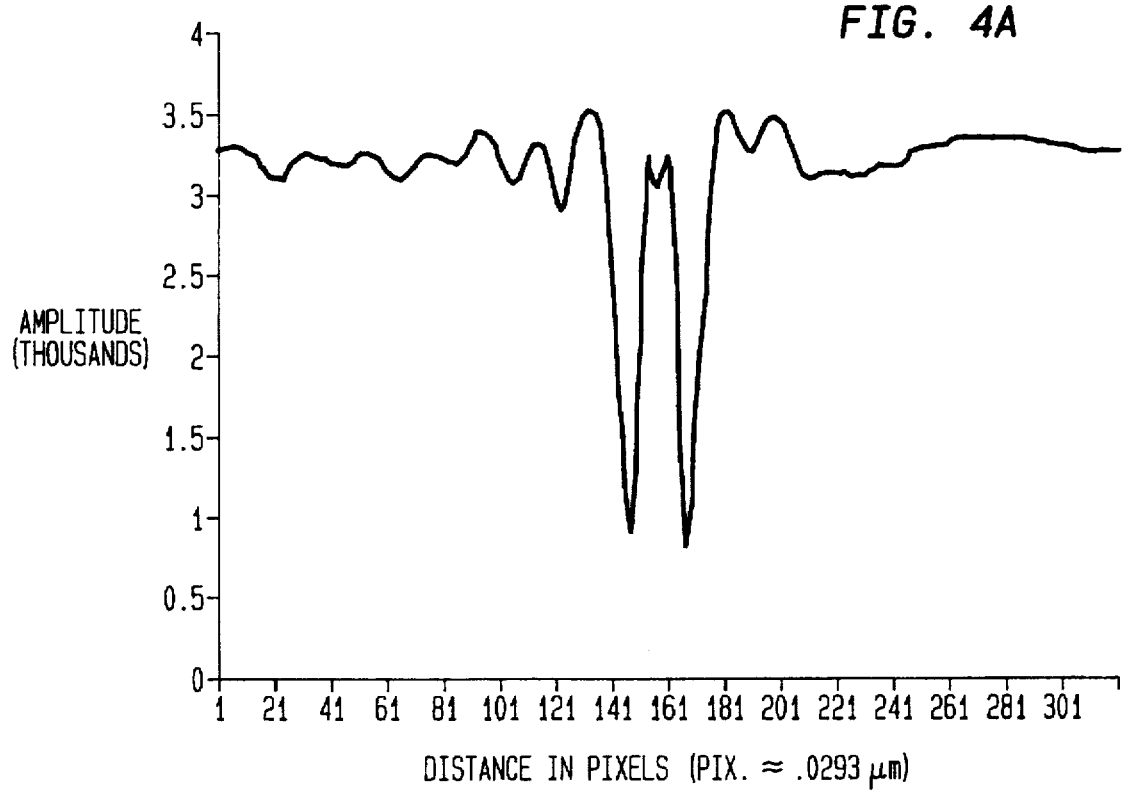
Figure 4B:
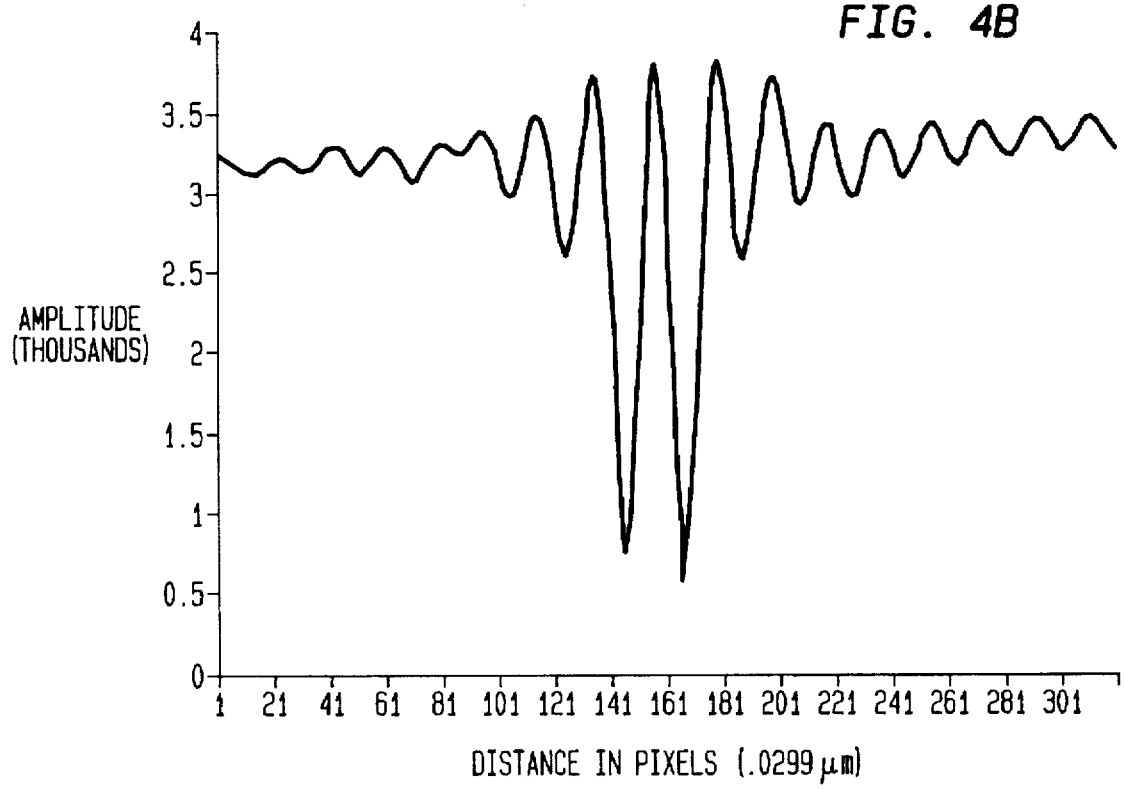
Figure 4C:
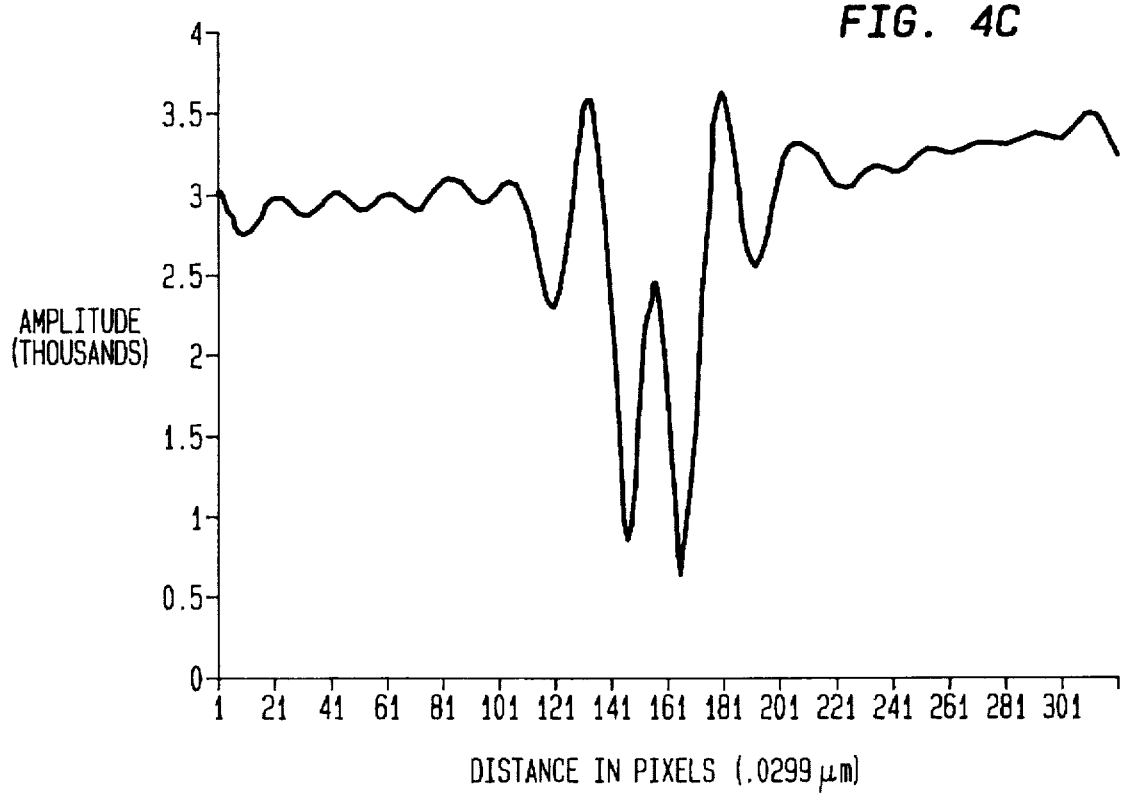
Figure 5A:
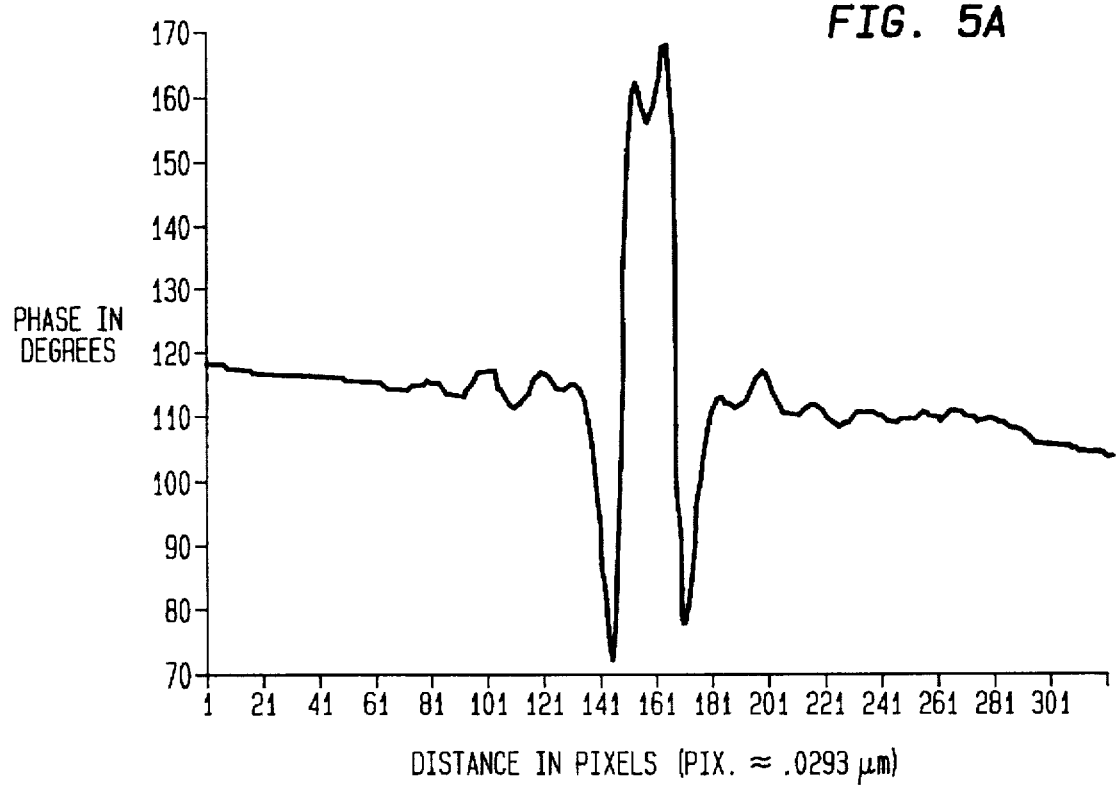
Figure 5B:
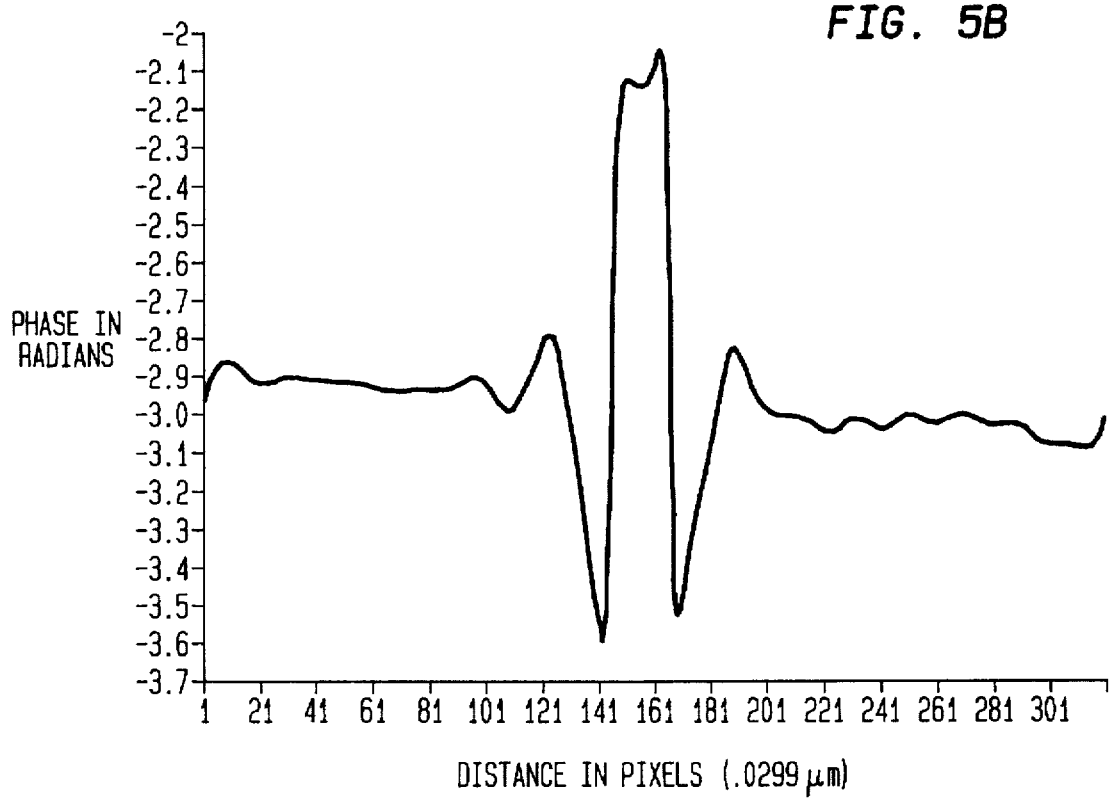
Figure 5C:
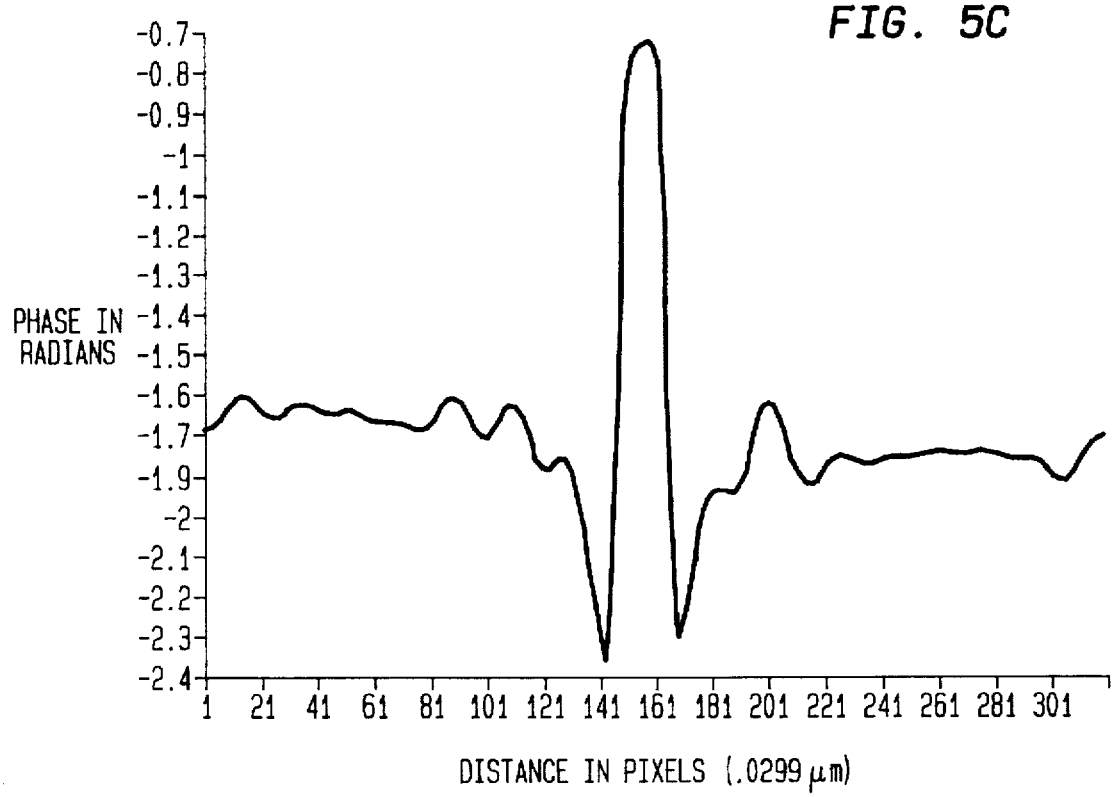
Figure 6A:
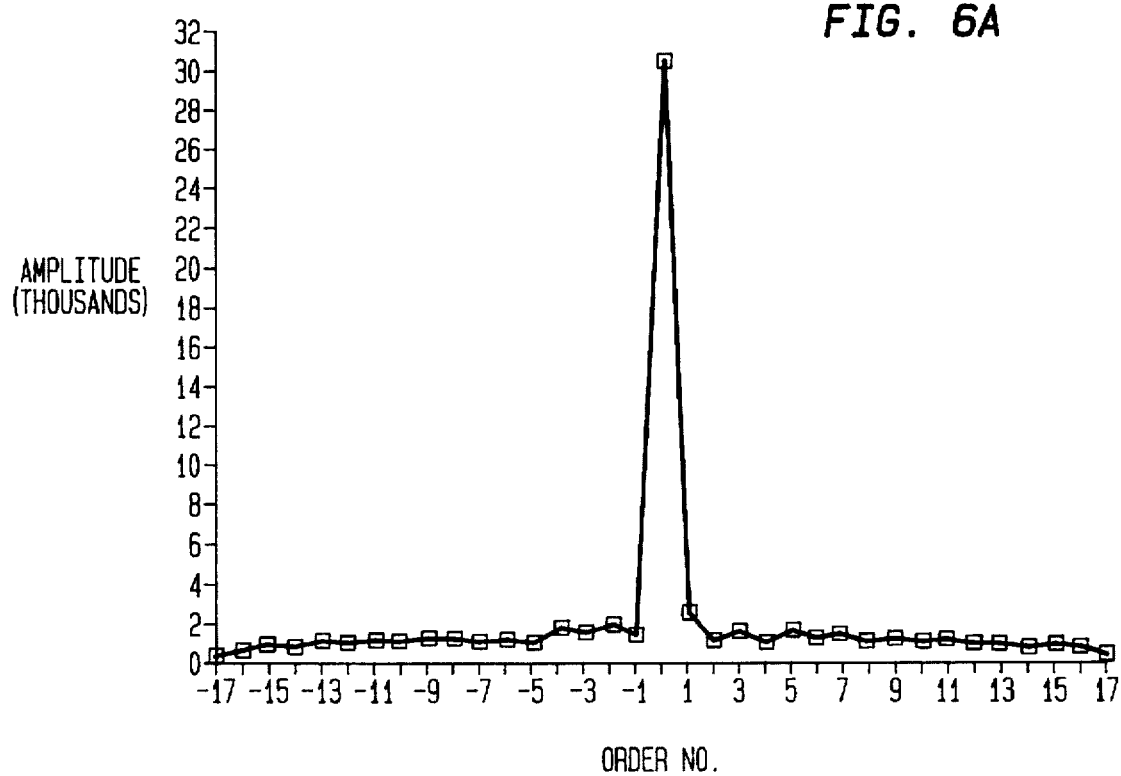
FIGS. 6A–6D are graphs showing a split in the phase portion of the Fourier spectrum of the image for slice 70 into its odd and even parts.
Figure 6B:
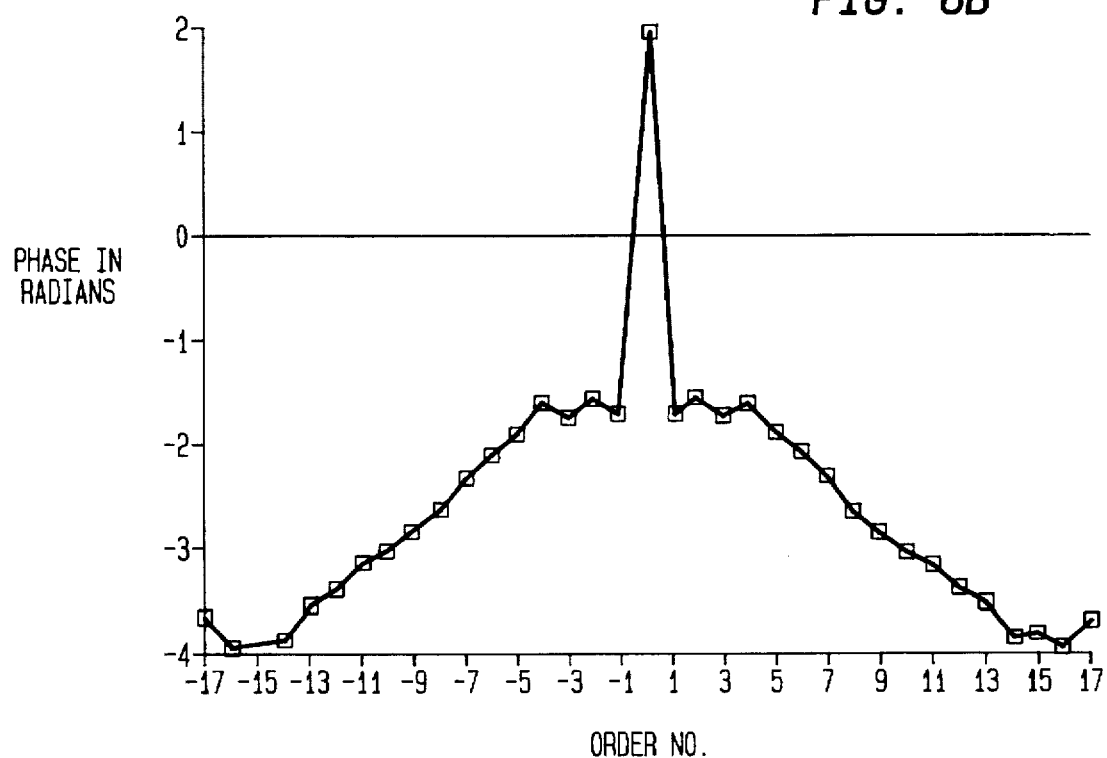
Figure 6C:
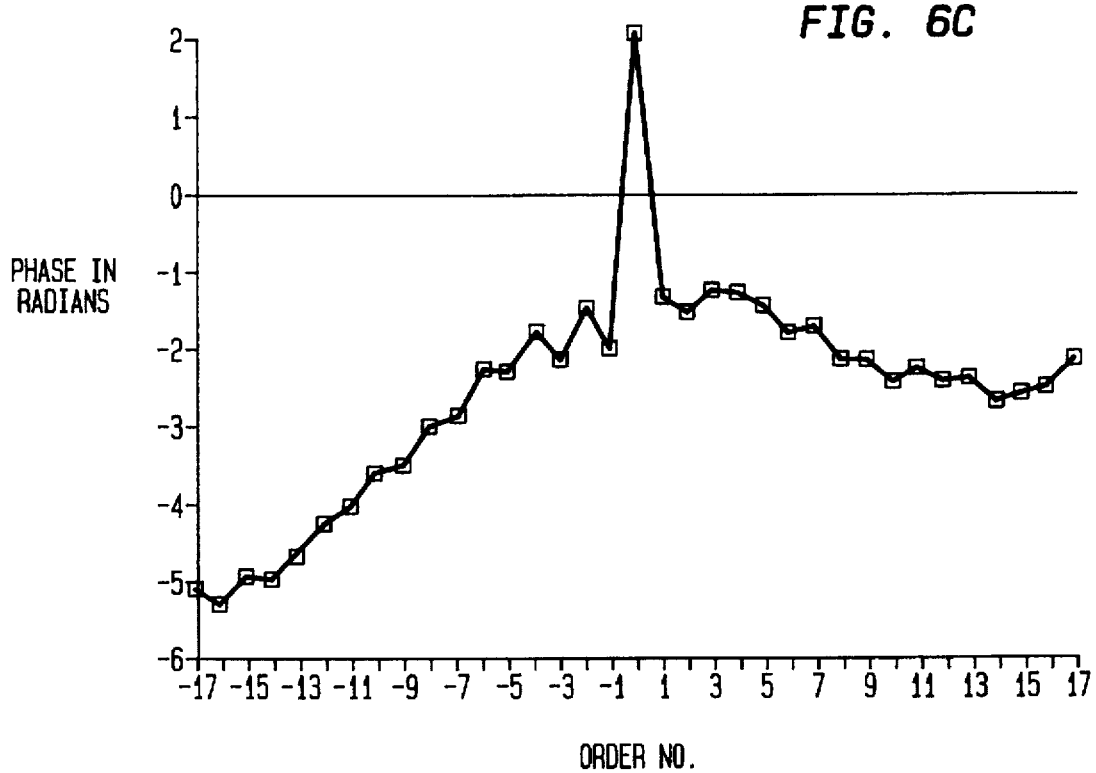
Figure 6D:
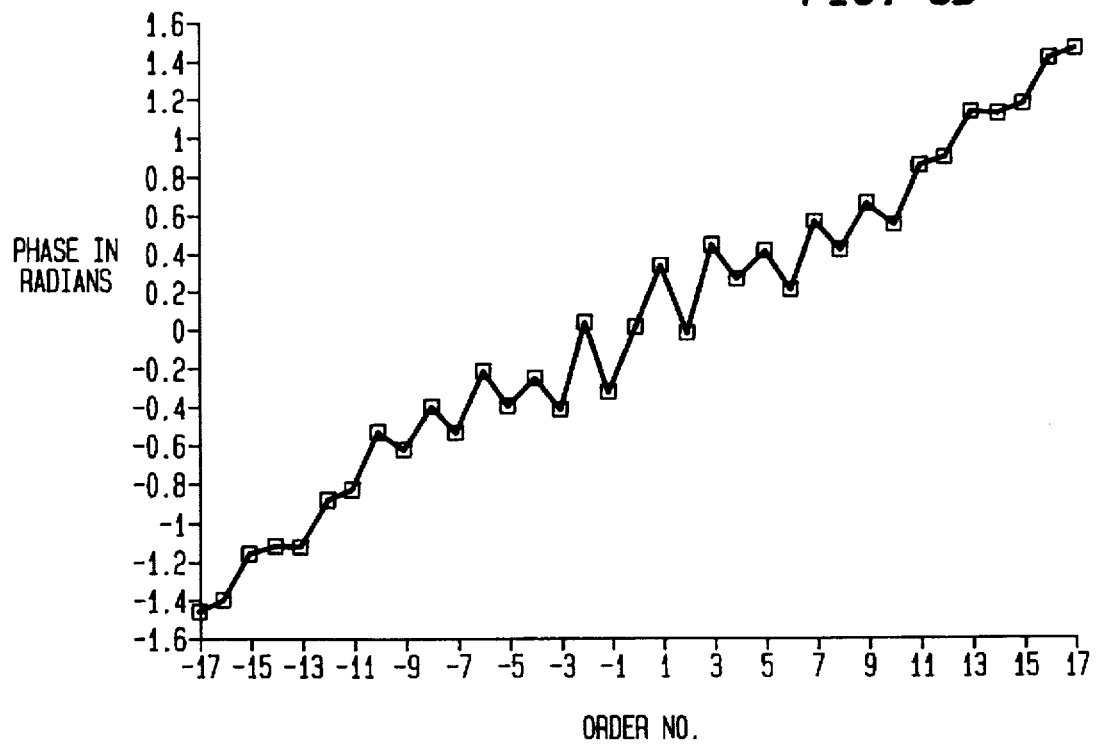

In FIGS. 2A–2D, 3A–3D, 4A–4C, and 5A–5C are graphs which demonstrate the ability to correct for defocus. Three slices have been taken in the amplitude and phase data file numbers 70, 80 and 90 corresponding to focus steps of approximately 0.3 μm each (10 slices.). Number 70 appears to have the best focus. The focus correction is performed by taking a fourier transform of the amplitude and phase image data, applying the defocus correction described below. Then the inverse transform is taken to get the corrected images. FIGS. 2A–D and 3A–D show the image amplitude and phase data from the modified coherence probe system. FIGS. 4A–C compare the focus corrected amplitude from slice 80 and slice 90 with the original slice 70. FIGS. 5A–C show similar amplitude and phase data for the phase images.

DEFOCUS CORRECTION $$\text{Delta } Z = \frac{2 * n * (\text{Lambda})}{\pi \tan^2(\Theta)} \text{ ; for 0.95 NA, } \tan^2\Theta \approx 9$$

PUPIL PLANE CORRECTION
$e^{i\Phi}$ where $$\Phi = \frac{m(\text{Lambda})}{\pi} \quad (\text{Rho})^2 = \frac{1}{2} \; (\tan^2\Theta((\text{Delta})Z) \; (\text{Rho})^2)$$

TABLE I

| (Delta) Z | m/π |
|---|---|
| 0.03 μm | 0.25 |
| 0.3 μm | 2.7 |
| 0.6 μm | 5.4 |

Table I assumes an NA of 0.95 and a wavelength of 514 nm.

CONSTANT TERM CORRECTION
(PATH LENGTH)

$$(\text{Delta})\phi = -\frac{(\text{Delta})Z}{2\,\text{Lambda}} \quad (\text{in air})$$

The correction for slice 80 corresponding to 2.7 waves of defocus (0.3 μm displacement along the direction of the z axis) is in good agreement; that for slice 90 corresponding to 5.4 waves (0.6 μm) is not as good. These are preliminary results, but they clearly show the ability to correct for defocus. The implication of these results is that there may be no need to collect more than one z-slice and that slice may be acquired with only a crude focussing method, thereby potentially reducing the cost of the instrument. This may be especially useful in extending these results to UV imaging.

Next, are shown some of the possibilities for correcting for phase errors. In FIGS. 6A–6D there is a split phase portion of the Fourier spectrum of the image for slice 70 into its odd and even parts. The odd part shows a linear slope due to the fact that the line was not centered in the frame. Superimposed on this is some oscillation which is surmised to have been generated by the algorithm which converted the fringes to amplitude and phase data.

Figure 7A:
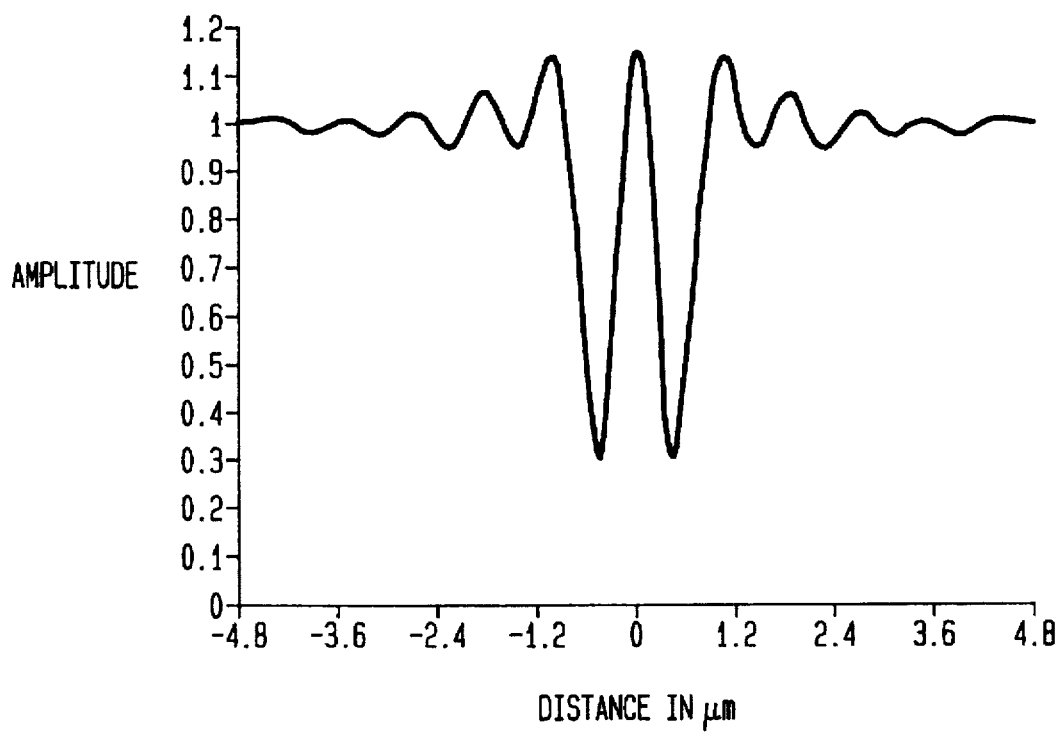
Figure 7B:
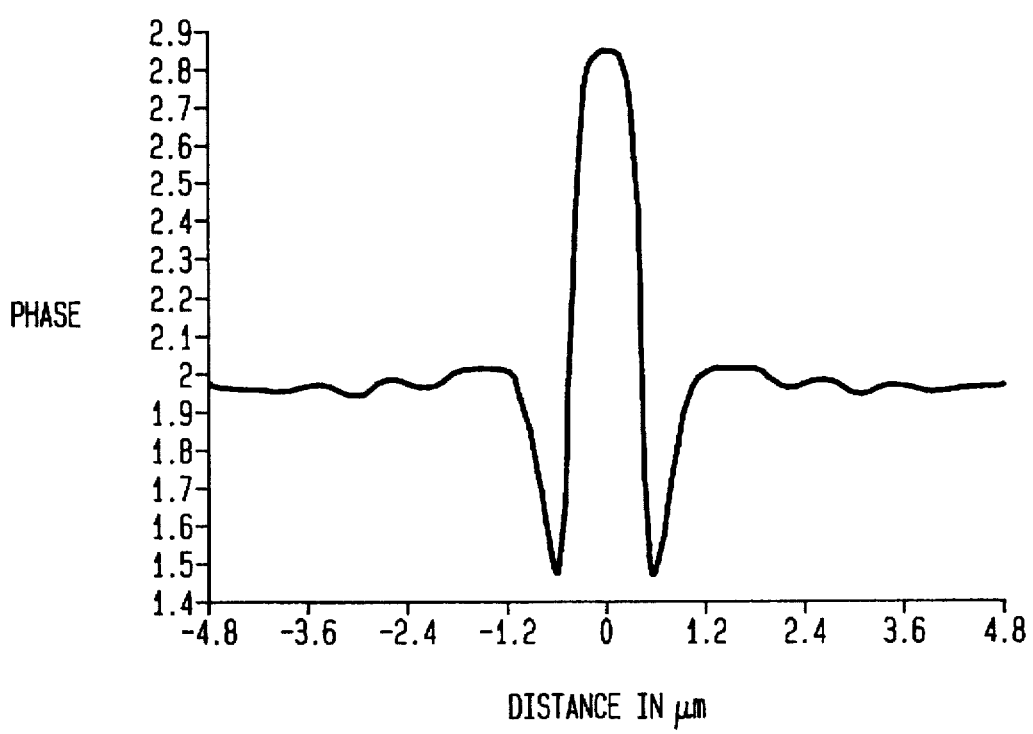
Figure 7C:
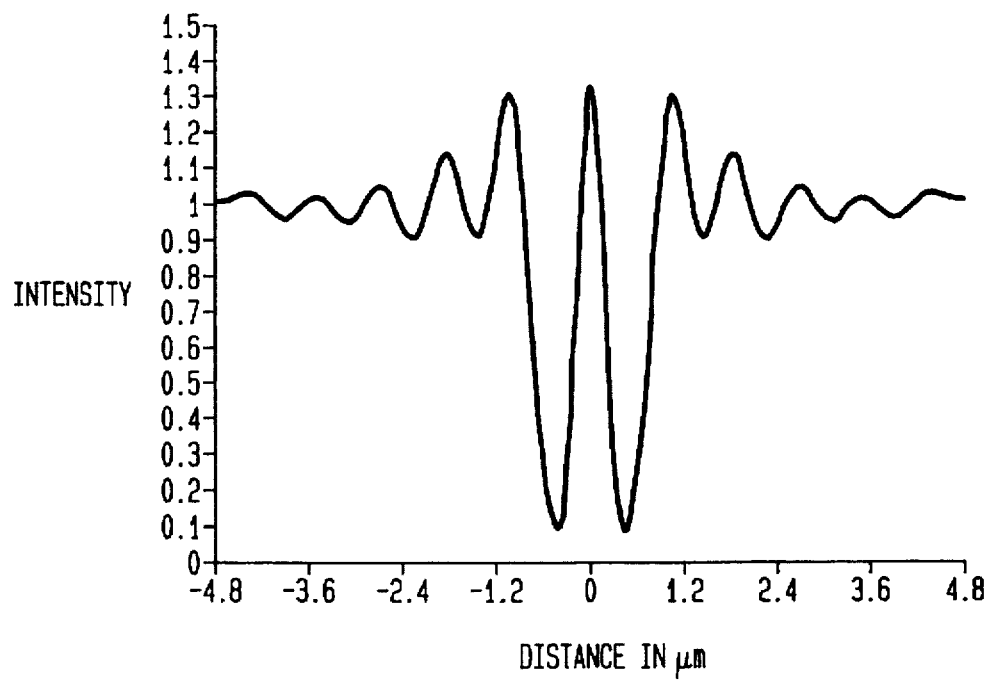

If one omits the asymmetric part of the phase and take the inverse transform, the results shown in FIGS. 7A–C are obtained. This is a much better quality image than the original. It is possible, if the aberrations of the imaging objective are known, such as coma (blur caused by spherical aberration of oblique rays of light passing through a lens) and spherical aberration (distortion resulting from deviation from spherical form, as in a lens or mirror) to remove the coma and the spherical aberration and thereby improve image quality. The implication of this is that less than perfect imaging optics can be used, thereby potentially reducing the cost of the system.

Although the discussion above has entirely omitted the asymmetric portion of the phase, it is preferable in CD and OL measurements to separate the asymmetry due to the line structure from that due to the imaging system. That can be done using a test structure of known quality to determine the contribution from the imaging system.

Note that high frequency structure in the original image introduced by the detection system has also been removed. That is due to the assumption of a 0.95 NA in taking the Fourier transform which acts as a low pass filter in these calculations.

Figure 8A:
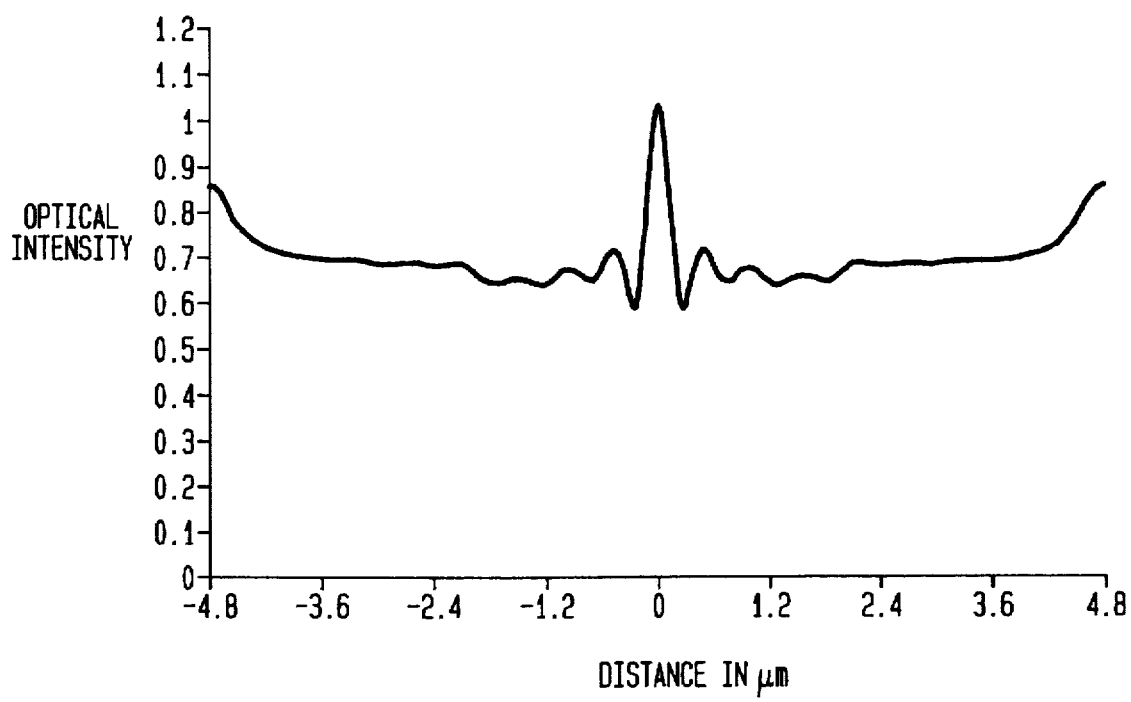
FIG. 8A shows the result of applying partially coherent imaging calculations to the Fourier spectrum of FIGS. 7A–7C assuming a 2D (two dimensional) 0.6 NA condenser aperture and 0.95 NA imaging lens.
Figure 8B:
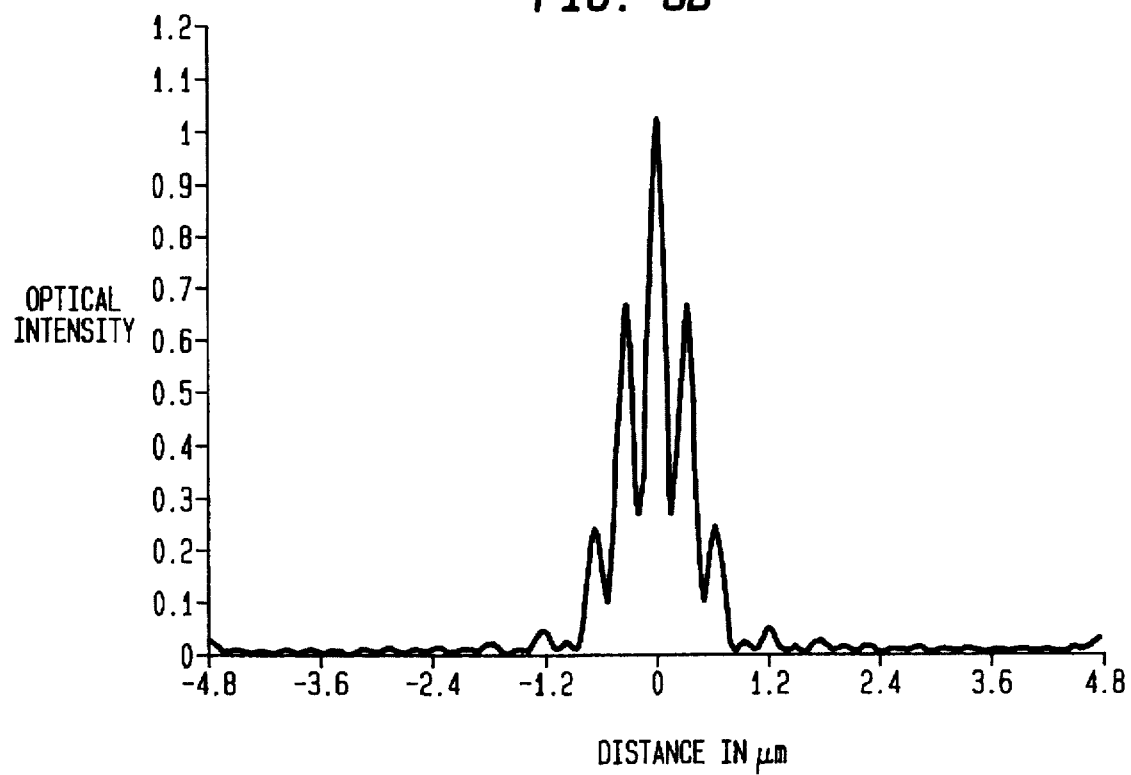
FIG. 8B shows the results of assuming dark-field imaging with a very narrow annulus just outside of the radius of the objective lens.

Now, given the good quality image amplitude and phase data in FIGS. 7A–7C, it is possible to generate other types of images corresponding to less spatial coherence, dark field imaging, etc. While this work is based on single wavelength data, it can be expanded to include computation of white light images. FIG. 8A shows the result of applying partially coherent imaging calculations to the Fourier spectrum of FIGS. 7A–7C assuming a 2D (two dimensional) 0.6 NA condenser aperture and 0.95 NA imaging lens. FIG. 8B shows the results of assuming dark-field imaging with a very narrow annulus Just outside of the radius of the objective lens. Dark-field imaging shows enhancement of the high frequency information in the image. If a wider annulus had been used, the contrast of the fringes surrounding the central peak could have been suppressed.

Figure 9A:
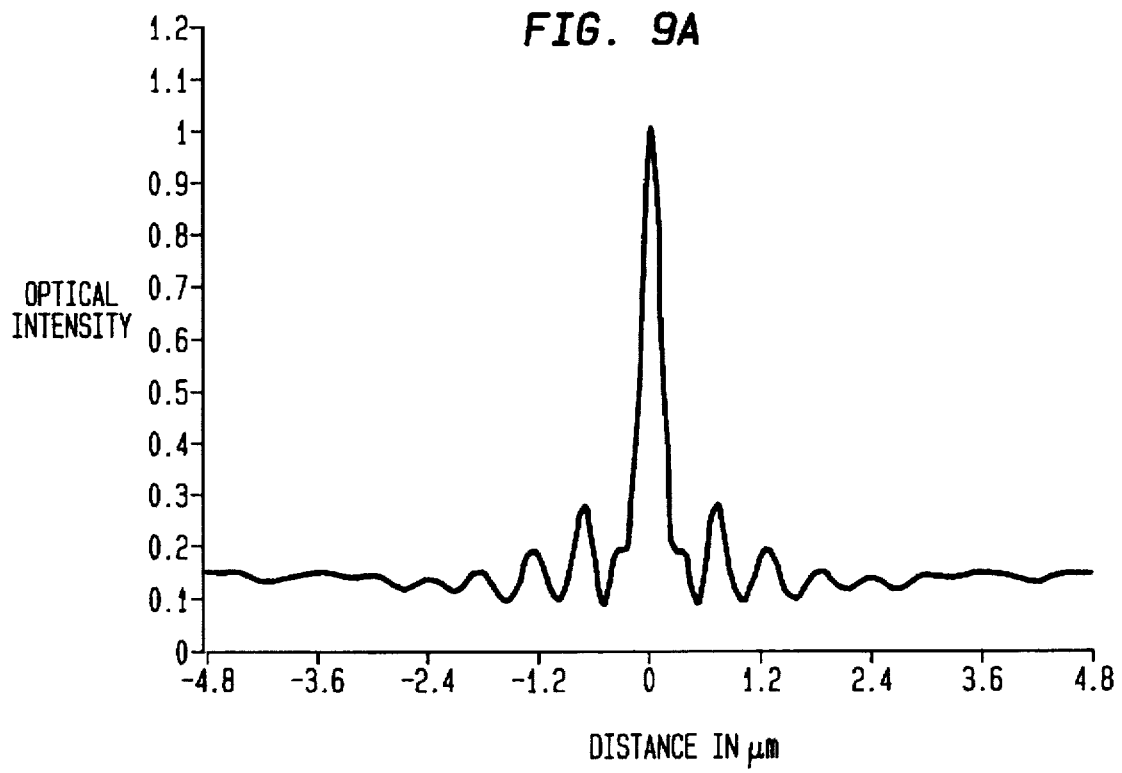
FIGS. 9A and 9B are graphs showing that it is also possible to change the contrast of the coherent image.
Figure 9B:
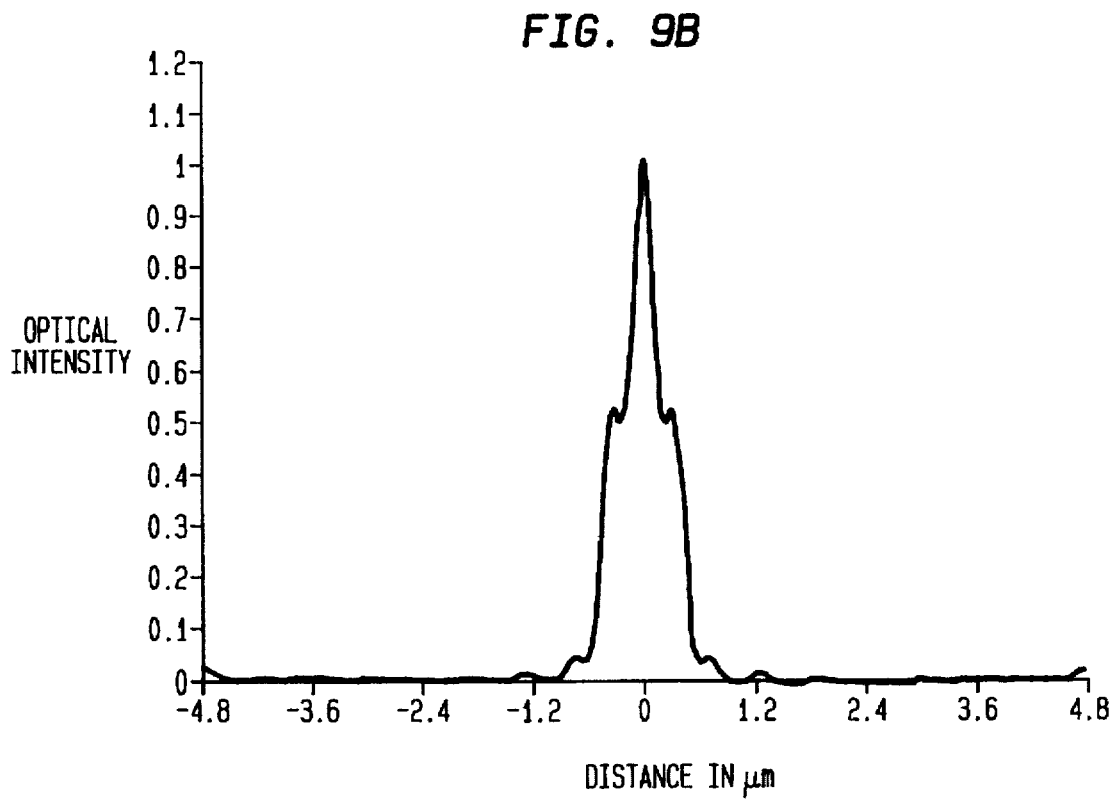

It is also possible to change the contrast of the coherent image as shown in FIGS. 9A and 9B. Here the amplitude of the DC term in the Fourier spectrum is decreased to two different levels. In FIG. 9A, the DC amplitude has been decreased by 4; in FIG. 9B it has been completely suppressed. The very small fringes which occur in the image are due to "thick layer imaging" effects which cause the non-linearities in optical CD measurements at these dimensions.

One imaging method of interest eliminates thick layer effects. Since one of the major effects of thick layer imaging is distortion of the phase portion of the Fourier spectrum, in FIG. 10A we have left out entirely the phase portion of the image spectrum and taken the inverse transform of the amplitude part only to produce a high contrast image without the fringes in the central lobe of the image as seen in FIG. 9A. (For wider lines it may be necessary to introduce pi-phase steps at zero-crossings of the amplitude to get the same results.)

Figure 10A:
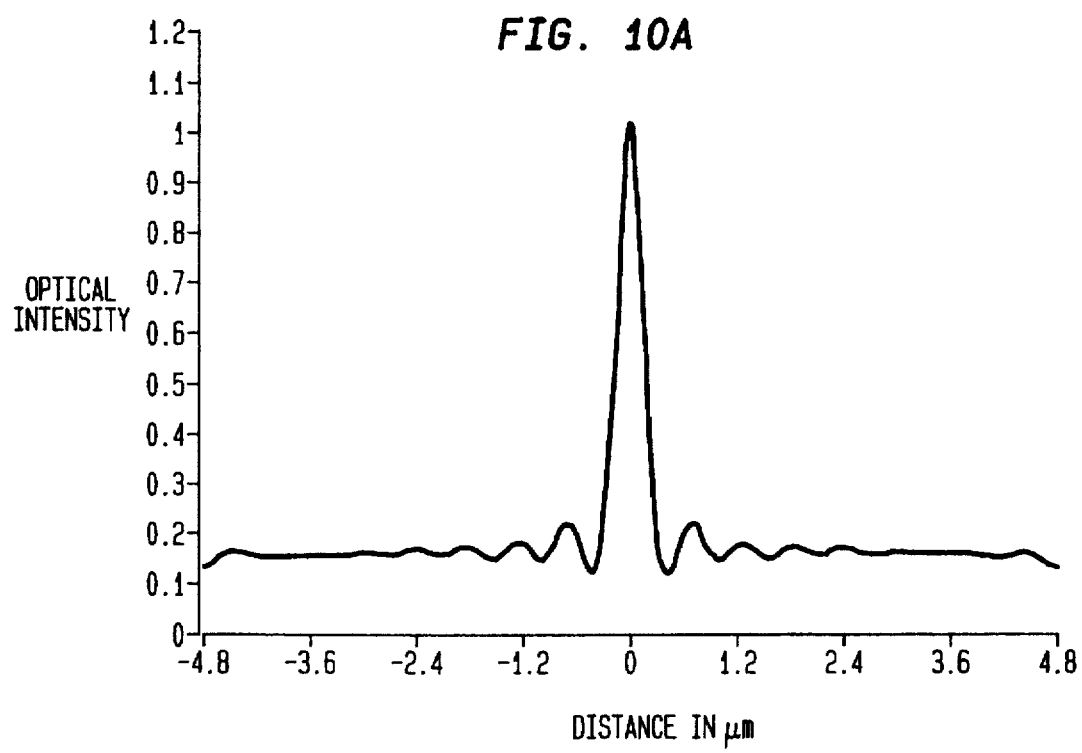
FIG. 10A is a graph showing the result of entirely leaving out the phase portion of the image spectrum and taken the inverse transform of the amplitude part only to produce a high contrast image without the fringes in the central lobe of the image as seen in FIG. 9A.
Figure 10B:
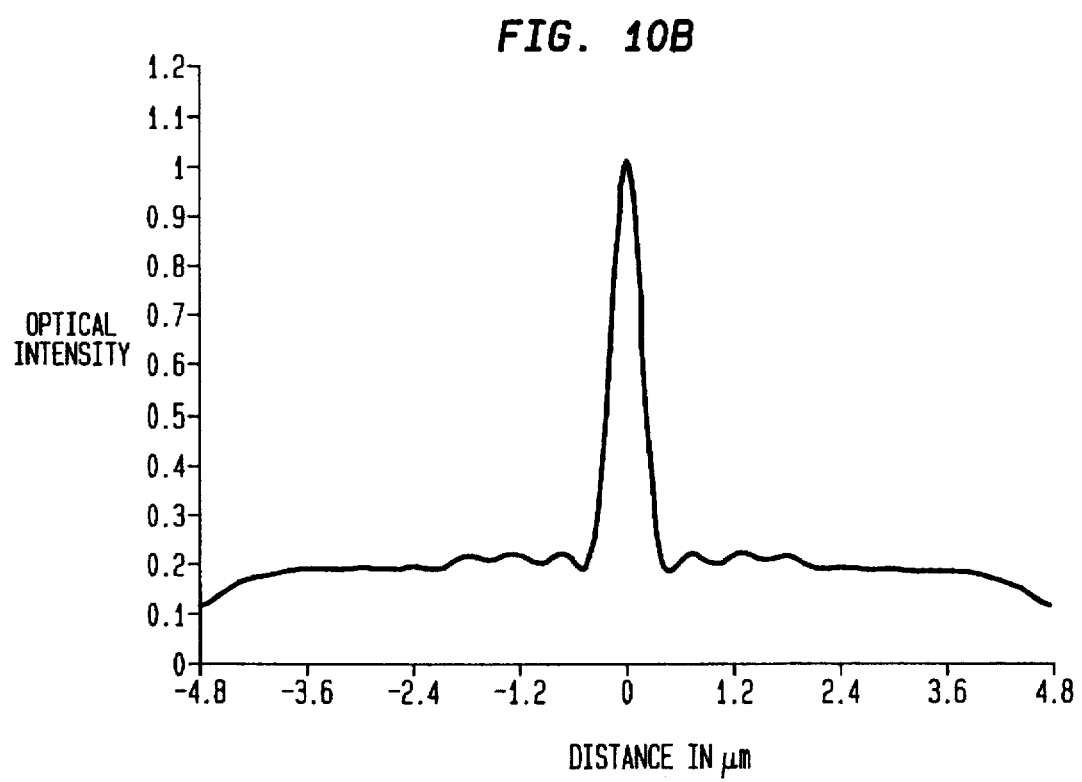
FIG. 10B is a graph showing the result leaving out the phase portion and using 0.6 NA 2D condenser lens for the image.

It is also possible to further suppress the fringes at the base of the central image by applying partially coherent imaging to the image of FIG. 10A. A 0.6 NA 2D condenser lens is assumed for the image shown in FIG. 10B. That is a "clean image" compared to the image slice 70 that was the starting image shown in FIGS. 2A–2D. It should yield better linearity and better reliability for CD and OL measurements.

While some of the possibilities for preprocessing image amplitude and phase data to improve CD and OL measurements have been described above, numerous others are possible. In particular, the choice of imaging method (bright field, dark field, confocal, etc.) becomes part of the measurement algorithm, thereby producing a much more versatile CD and OL tool. The most promising of these techniques are adapted to improvement of linearity, resolution, etc. for both thick and thin layers and more complex structures.

Figure 11:
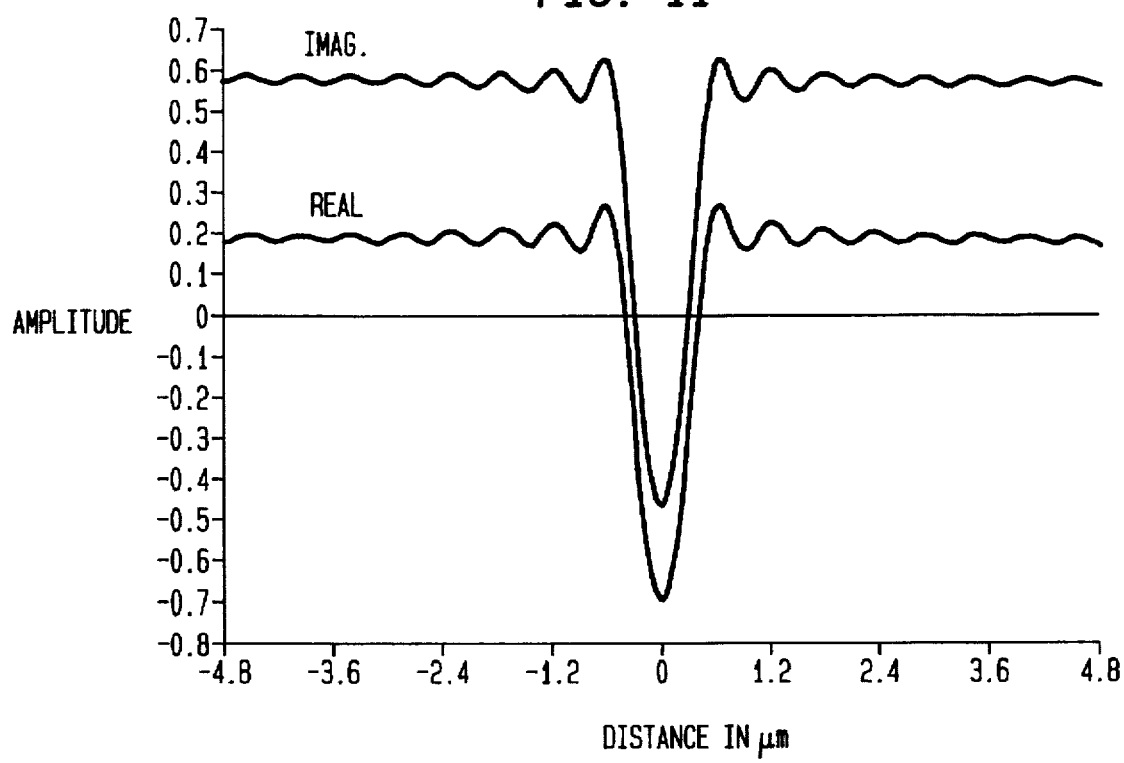
FIG. 11 is a graph showing that it is possible to use either the real or the imaginary part of the complex amplitude (amplitude and phase) images to make CD and OL measurements directly without preprocessing.

Referring to FIG. 11, in addition to the methods described above, it is also possible to use either the real or the imaginary part of the complex amplitude (amplitude and phase) images to make CD and OL measurements directly without preprocessing. As shown below, the real and imaginary images have less complex structure and therefore, simple algorithms can be applied. However, it would not be possible to correct for defocus and aberrations without first taking the complex Fourier transform, applying the correction and inverse transforming to get the real or imaginary image.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. An imaging system for a pattern on a substrate, comprising:

means for amplitude and phase imaging for narrow angle, single wavelength, polarized illumination in an interferometric microscope system, said microscope system including a microprocessor providing signals derived from said amplitude and phase imaging, means for deriving raw interferometer fringe data from said microprocessor, means for converting said fringe data into amplitude and phase data, means for deriving the fourier transform of said amplitude and phase data, means for applying corrections to said transformed data to provide corrected transformed data, means for selecting image type and means for deriving an inverse transform from said corrected transformed data and means for processing to provide amplitude data, and phase image data as a first image output, and means for bright field image processing to provide a second image output, and means for dark field image processing to provide a third image output, and means for processing of a value of a corrected phase image data to provide a fourth image output, and means for processing of a corrected amplitude data to provide a fifth image output.

2. A system in accordance with claim 1 including means for determining the critical dimension selected from said first, second, third, fourth and fifth image output.

3. A system in accordance with claim 1 wherein said pattern on said substrate comprises a layered structure including means for determining at least one dimension of at least one shape in said layered structure from one of said image outputs.

4. An optical measuring method for measuring a pattern on a substrate with the output of an optical imaging system, amplitude and phase imaging for narrow angle, single wavelength, polarized illumination in a coherence probe type of interferometric microscope system, said microscope system including a microprocessor providing signals derived from said amplitude and phase imaging, comprising:

deriving raw interferometer fringe amplitude and phase data from said microprocessor, converting said fringe amplitude and phase data into amplitude and phase data, deriving a fourier transform of said amplitude and phase data, and applying corrections to said transformed data to provide corrected data, selecting image type and then deriving the air inverse transform from said corrected data and processing to provide amplitude and phase image data as a first image output, and bright field image processing to provide a second image output, and dark field image processing to provide a third image output, and processing the corrected phase image data to provide a fourth image output, processing the corrected amplitude to provide a fifth image output, and measuring a value selected from the group consisting of critical dimension and overlay from one of said image outputs.

5. A method in accordance with claim 4 wherein corrections are provided for defocus.

6. A method in accordance with claim 4 wherein corrections are provided for asymmetry.

7. A method in accordance with claim 4 wherein corrections are provided for noise.

8. A method in accordance with claim 4 wherein the corrections are provided for aberrations of the optical components.

9. An imaging system for a pattern on a substrate, comprising:

means for amplitude and phase imaging for narrow angle, single wavelength, polarized illumination in an interferometric microscope system, said microscope system including a microprocessor providing signals derived from said amplitude and phase imaging, means for deriving raw interferometer fringe data from said microprocessor, means for converting said fringe data into amplitude and phase data, means for deriving the fourier transform of said amplitude and phase data, means for applying corrections to said transformed data to provide corrected data, means for selecting image type and then means for deriving the inverse transform from said corrected data and processing to provide amplitude and means for providing data selected from the group consisting of as follows:
a) phase image data as a first image output,
b) bright field image data as a second image output,
c) dark field image data as a third image output, and
d) the corrected phase image data as a fourth image output, and
e) corrected amplitude to provide a fifth image output.

10. A system in accordance with claim 9 including means for determining the critical dimension selected from the group comprising said first, second, third, fourth and fifth image output.

11. A system in accordance with claim 9 wherein said pattern on said substrate comprises a layered structure including means for determining at least one dimension of at least one shape in said layered structure from one of said image outputs.

12. An optical measuring method for measuring a pattern on a substrate with the output of an optical imaging system, amplitude and phase imaging for narrow angle, single wavelength, polarized illumination in a coherence probe type of interferometric microscope system, said microscope system including a microprocessor providing signals derived from said amplitude and phase imaging, comprising:

deriving raw interferometer fringe amplitude and phase data from said microprocessor, converting said fringe amplitude and phase data into amplitude and phase data, deriving a fourier transform of said amplitude and phase data, and applying corrections to said transformed data to provide corrected transformed data, providing data selected from the group consisting of as follows:
a. selecting an image type and then deriving an inverse transform from said corrected data and processing to provide corrected amplitude data and providing corrected phase image data as a first image output,
b. bright field image processing to provide a second image output,
c. dark field image processing to provide a third image output,
d. processing of the corrected phase image to provide a fourth image output, and
e. processing of said corrected amplitude data to provide a fifth image output, and measuring critical dimension or overlay from one of said first, second, third, fourth and fifth image outputs.

13. A method in accordance with claim 12 wherein corrections are provided for defocus.

14. A method in accordance with claim 12 wherein corrections are provided for asymmetry.

15. A method in accordance with claim 12 wherein corrections are provided for noise.

16. A method in accordance with claim 12 wherein the corrections are provided for aberrations of the optical components.

17. A system in accordance with claim 1 including means for determining the overlay selected from said first, second, third, fourth and fifth image output.

* * * * *

UNITED STATES PATENT AND TRADEMARK OFFICE
CERTIFICATE OF CORRECTION

PATENT NO. : 5,633,714
DATED : May 27, 1997
INVENTOR(S) : Diana Nyyssonen

It is certified that error appears in the above-indentified patent and that said Letters Patent is hereby corrected as shown below:

ABSTRACT

Col. 2, line 18, correct "phase image $P''(\mu,z_n)$ to"
to read -- phase image $p''(\mu,z_n)$ to --;

Col. 10, line 25 correct "selecting image type and then deriving the air inverse"
to read --selecting image type and then deriving an inverse --

Signed and Sealed this

Twenty-sixth Day of August, 1997

*Attest:*

BRUCE LEHMAN

*Attesting Officer*     *Commissioner of Patents and Trademarks*